(12) United States Patent
Emori et al.

(10) Patent No.: US 6,314,017 B1
(45) Date of Patent: Nov. 6, 2001

(54) SEMICONDUCTOR MEMORY DEVICE

(75) Inventors: Takashi Emori; Toshio Kobayashi; Naoshi Ikeda, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/621,652

(22) Filed: Jul. 21, 2000

(30) Foreign Application Priority Data

Jul. 22, 1999 (JP) .................................................. 11-207428
Jan. 7, 2000 (JP) .................................................. 12-006008

(51) Int. Cl.[7] .......................... G11C 11/24; H01L 27/108
(52) U.S. Cl. .................... 365/149; 365/185.08; 365/187; 257/296; 257/300
(58) Field of Search .................................... 365/149, 150, 365/185.08, 187; 257/296, 298, 300

(56) References Cited

U.S. PATENT DOCUMENTS

| | | | |
|---|---|---|---|
| 4,803,664 | * 2/1989 | Itoh | 365/210 |
| 5,675,160 | * 10/1997 | Oikawa | 257/296 |
| 5,712,817 | * 1/1998 | Suh | 365/185.08 |
| 5,936,881 | * 8/1999 | Kawashima et al. | 365/149 |
| 6,016,268 | * 1/2000 | Worley | 365/149 |
| 6,121,079 | * 9/2000 | Kim | 438/199 |

* cited by examiner

Primary Examiner—Son Mai
(74) Attorney, Agent, or Firm—Sonnenschein, Nath & Rosenthal

(57) ABSTRACT

A semiconductor memory device comprising a write transistor with a gate connected to a write word line and with a first impurity region forming a source or drain connected to a bit line, a read transistor with a gate connected to a second impurity region forming a source or drain of the write transistor, a first impurity region connected to a read word line, and a second impurity region connected to a bit line, and a capacitor connected between the gate and the second impurity region of the read transistor.

20 Claims, 15 Drawing Sheets

CROSS SECTION BY A-A

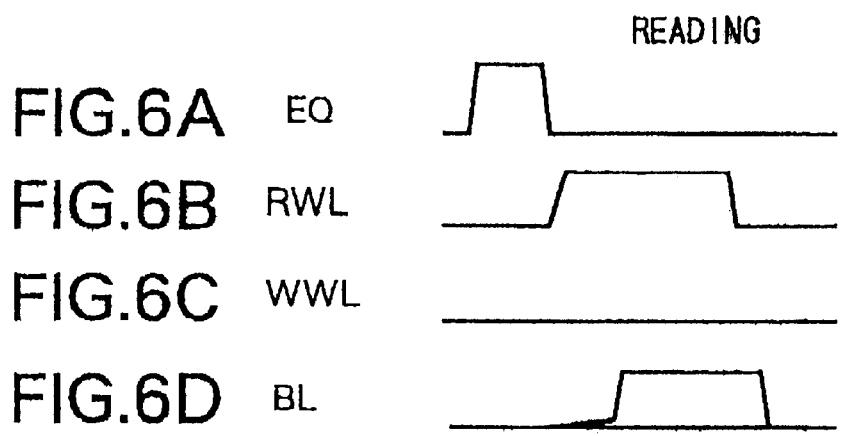
FIG.6A EQ
FIG.6B RWL
FIG.6C WWL
FIG.6D BL
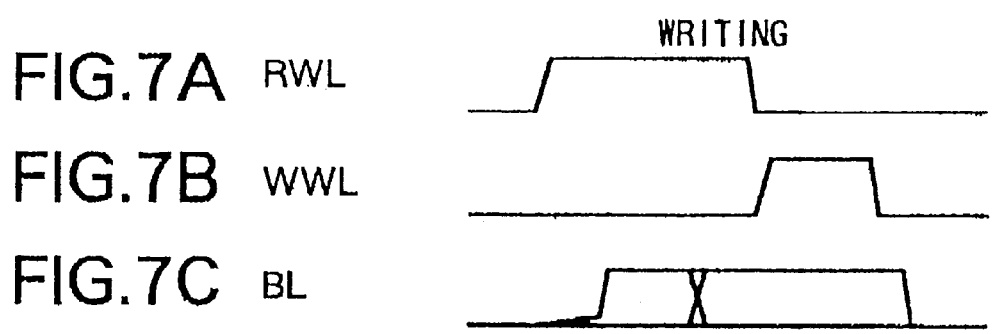
FIG.7A RWL
FIG.7B WWL
FIG.7C BL
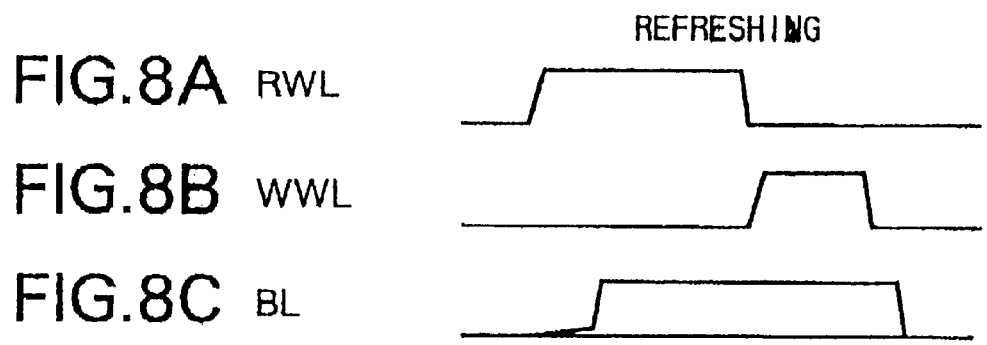
FIG.8A RWL
FIG.8B WWL
FIG.8C BL FIG.12
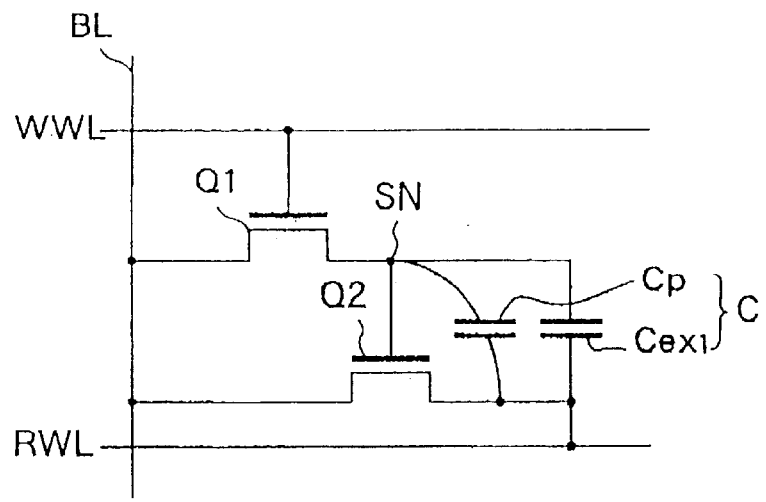
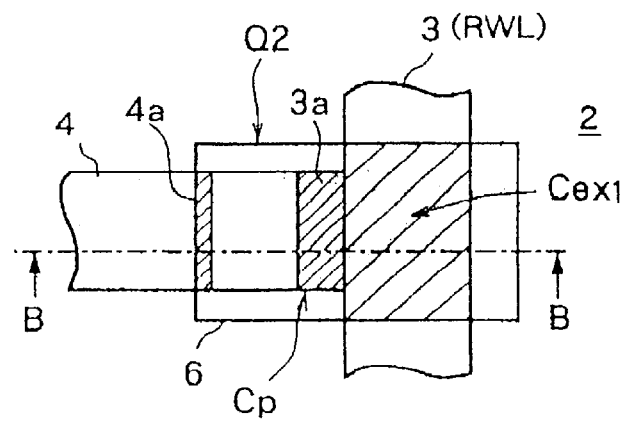
FIG.13A
CROSS SECTION BY B-B
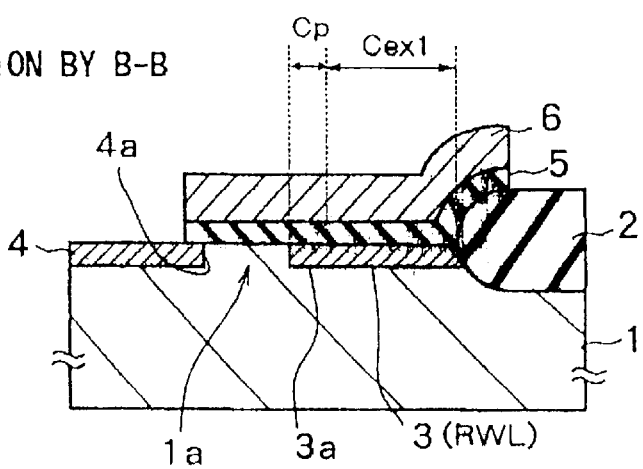
FIG.13B

CROSS SECTION BY B-B

CROSS SECTION BY C-C

CROSS CECTION BY D-D

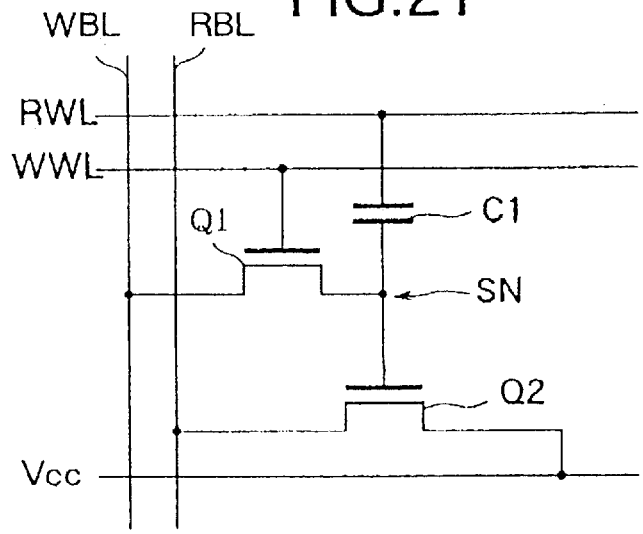
FIG. 21
READING
FIG. 22A RWL 
FIG. 22B WWL
FIG. 22C RBL 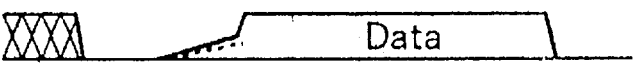
WRITING
FIG. 23A RWL
FIG. 23B WWL 
FIG. 23C WBL 
FIG. 23D SN 

US 6,314,017 B1

SEMICONDUCTOR MEMORY DEVICE

RELATED APPLICATION DATA

The present application claims priority to Japanese Application No. P11-207428 filed Jul. 22, 1999 and Japanese Application No. P2000-006008 filed Jan. 7, 2000; which applications are incorporated herein by reference to the extent permitted by law.

BACKGROUND OF THE INVENTION

1. Field of the Invention

The present invention relates to a semiconductor memory device having a 2-transistor and 1-capacitor type memory cell, one type of a so-called gain cell, reading a storage data held in the cell, amplifying the same by a read transistor and reading it out onto a bit line.

2. Description of Related Art

In a dynamic random access memory (DRAM) for holding a signal voltage by the capacitance of a capacitor and storing information corresponding to the held signal voltage, memory cells have been miniaturized more and more along with the increasing capacity of recent years. The miniaturization of the memory cells has led to a reduction in the capacitance of the capacitor. As a result, the amplitude of a read signal has become small, so it is becoming difficult to secure stability of operation at a read operation and guarantee precision of the read data. For this reason, attention is being paid to a so-called gain cell for holding a signal voltage at the gate of the read transistor, amplifying the signal voltage by the read transistor at the read operation, and outputting the same to the bit line.

FIG. 21 is a circuit diagram of an example of the configuration of the 2-transistor and 1-capacitor type memory cell of one type of gain cell.

As illustrated, this memory cell is configured by a write transistor Q1, a read transistor Q2, and a capacitor C1. One electrode of the capacitor C1 is connected to a read word line RWL, while the other electrode is connected to a storage node SN. In the write transistor Q1, the gate is connected to a write word line WWL, the drain is connected to a write bit line WBL, and the source is connected to the storage node SN. In the read transistor Q2, the gate is connected to the storage node SN, the source is connected to a read bit line RBL, and the drain is connected to a supply line (a ground line also possible) of a power supply voltage $V_{cc}$.

A plurality of memory cells shown in FIG. 21 are used and arranged in the form of an array, memory cells of each column are connected to the identical write bit line WBL and read bit line RBL, the gates of the write transistors Q1 of the memory cells of each row are connected to the identical write word line WWL, the capacitors C1 are connected to the identical read word line RWL, and thus a DRAM type semiconductor memory can be configured.

In the semiconductor memory, the write word line WWL and the read word line RWL are driven by the word line drive circuit. A write data buffer is connected to the write bit line WBL, a sense amplifier is connected to the read bit line RBL, and at the time of a read operation, the read bit line voltage of each is detected by the sense amplifier, whereby the data stored in the selected memory cell is read out.

Below, an explanation will be made of the read and write operations in the memory cell shown in FIG. 21 by referring to FIGS. 22A to 22C and FIGS. 23A to 23D.

FIGS. 22A to 22C are timing charts of the operation at the time of a read operation of the memory cell shown in FIG. 21. Before the read operation, as shown in FIG. 22C, first, each read bit line RBL is discharged to the low level, for example, a ground potential, and held in a floating state. Thereafter, a read voltage of the high level is applied to the read word line RWL as shown in FIG. 22A. By this, the read transistor Q2 is turned on or off corresponding to the storage data of the memory cell connected to the read word line RWL. For example, the read transistor Q2 of the memory cell holding the data "1" is turned on, and conversely the read transistor Q2 of the memory cell holding the data "0" maintains the off state. When the read transistor Q2 is turned on, the read bit line RBL is charged by the power supply voltage $V_{cc}$ and shifts to the high level. On the other hand, in a memory cell where the read transistor Q2 is off, the potential of the read bit line RBL does not change, and the low level after the discharge is maintained.

By the sense amplifier connected to the read bit line RBL, the potential difference of the read bit line RBL is detected, and the storage data of each memory cell is read out.

FIGS. 23A to 23D are timing charts showing the operation at the time of a write operation of the memory cell shown in FIG. 21. As shown in FIG. 23C, first, a voltage corresponding to the write data is supplied to the write bit line WBL. After the potential of the write bit line WBL is decided, a write voltage of the high level is supplied to the write word line WWL, whereby the write transistor Q1 is turned on, and the held voltage (or a voltage corresponding to the held voltage) of the write bit line WBL is transmitted to the storage node SN. Thereafter, when the write word line WWL shifts to the low level and the write transistor Q1 is turned off, the storage node SN exhibits a floating state, and the signal voltage is held at the storage node SN.

In a refresh operation, the read and write operations mentioned above are sequentially executed. By the read operation, the voltage of the read bit line RBL is set corresponding to the storage data of the memory cell. Thereafter, corresponding to the voltage of the read bit line RBL, for example by a refresh control circuit, the voltage of the write bit line WBL is set, and the voltage is written into the storage node SN again through the write transistor Q1.

The stored charge of a memory cell decreases along with the elapse of time mainly as an off leak current or the like of the write transistor Q1, but by periodically executing this refresh operation, the stored information can be restored before discrimination becomes impossible.

In a 2-transistor and 1-capacitor type gain cell having such a circuit configuration, as the capacitor structure in the memory cell, there is an MOS capacity type using an impurity region of the semiconductor substrate as a lower electrode. Further, there is a stack type forming an upper electrode and a lower electrode above the transistors Q1 and Q2 together with the interconnection and sandwiching a dielectric film between the electrodes in the middle of the formation. Further, there exists a floating gate type with the read transistor Q2 given a floating gate structure, connecting that floating gate as the storage node SN to the source or drain of the write transistor, and utilizing a capacitor inside the transistor Q2 formed by using the floating gate and the control gate (read word line RWL) insulated and isolated by an insulating film between gates as the electrodes for boosting the storage node voltage at the time of a read operation.

Summarizing the problems to be solved by the invention, however, in all gain cells, the drain of the read transistor Q2 must be connected to the supply line (or the ground line) of the power supply voltage $V_{cc}$, therefore it was necessary to secure the interconnection region of that voltage supply line inside the memory cell. Further, when the voltage supply line is formed from an upper interconnection, a contact for connecting the read transistor to the voltage supply line must be formed. Further, two bit lines for writing and reading were required for each memory cell, so a large space became necessary in order to arrange the bit lines or form a bit contact.

Further, particularly in the MOS capacity type, the contact for connecting the semiconductor impurity region as the lower electrode of the capacitor to the gate electrode of the transistor became one of the factors behind the increase of the cell area. As a structure for making the contact unnecessary, it has been proposed to employ a TFT type as the read transistor and form the read transistor and capacitor in the upper layer of the write transistor ("A New SOI DRAM Gain Cell for Mbit DRAM's", H. Shichijo et al., *Extended Abstracts of the 16th Conference on Solld State Device and Materials*, A-7-3, 1984, pp. 265–268). In this memory cell, however, a disadvantage occurs that the formation of the TFT type transistor complicates the manufacturing step.

In the stack type, a multilayer interconnection structure for forming the capacitor electrode was necessary, and the capacitor dielectric film had to be separately formed from the inter-layer insulating film between interconnections since it had to be relatively thin, so it was necessary to add a manufacturing step for this purpose.

In the floating gate type, the gate structure of the read transistor was special and complex, so the match of the manufacturing process with the write transistors and other, for example, logic gate transistors was poor.

As described above, in the 2-transistor and 1-capacitor type gain cell of the related art, there was the problem that an increase of the memory cell area or an increase of the number of manufacturing steps could not be avoided.

SUMMARY OF THE INVENTION

An object of the present invention is to provide a semiconductor memory device having a memory cell in which an interconnection space and contact for supplying the power supply voltage or the ground potential are unnecessary in the memory cell, the storage node boosting capacitor can be easily formed in the manufacturing steps of two transistors, the area is reduced, and the number of manufacturing steps is decreased.

To attain the object, according to a first aspect of the present invention, there is provided a semiconductor memory device having a memory cell comprising a write transistor with a gate connected to a write word line and with a first impurity region forming a source or drain connected to a bit line, a read transistor with a gate connected to a second impurity region forming a source or drain of the write transistor, a first impurity region connected to a read word line, and a second impurity region connected to a bit line, and a capacitor connected between the gate and the first impurity region of the read transistor.

For example, the capacitor is comprised by a parasitic capacitance inside the read transistor. In this case, in the read transistor, it is better if the area of an overlap portion of the first impurity region and the gate electrode where the parasitic capacitance is formed is made larger than the area of the overlap portion between the second impurity region and the gate electrode.

Where the capacitor is comprised by the parasitic capacitance inside the read transistor and an external capacitance element connected to the outside of the read transistor, the external capacitance element may be formed at a portion where the gate electrode overlaps the impurity region forming the read word line.

Alternatively, the capacitor may be mainly comprised by only an external capacitance element. In this case, if the overlap area is determined to an extent of creation due to diffusion of the impurity in a lateral direction, there is almost no variation of capacitor area due to overlapping of the gate electrodes on each other.

Further, it is also possible to arrange the external capacitance elements on and under the gate electrode.

The memory may further comprise a write control circuit for holding the bit line at a voltage corresponding to a write data, applying a write voltage to the write word line to turn on the write transistor, transmitting a voltage corresponding to the held voltage of the bit line to the gate of the read transistor and having it held there at the time of a write operation and a read control circuit for applying a read voltage to the read word line and controlling the on or off state of the read transistor in accordance with the held voltage held at the gate of the read transistor at the time of a read operation.

The memory may further also have a first memory cell and a second memory cell with gates of write transistors connected to a common write word line. The bit line includes a first bit line with the write transistor of the first memory cell and the read transistor of the second memory cell connected to it and a second bit line with the read transistor of the first memory cell and the write transistor of the second memory cell connected to it.

In the semiconductor memory according to the present invention, each memory cell is configured by a write transistor, read transistor, and capacitor, the gate of the write transistor is connected to the write word line, and the first impurity region forming one of the source or drain thereof is connected to the bit line. In the read transistor, the gate thereof is connected to the other second impurity region of the write transistor, the first impurity region thereof is connected to the read word line, and the second impurity region thereof is connected to the bit line. The capacitor is connected between the gate electrode and the first impurity region of the read transistor.

At the time of a write operation, a voltage corresponding to the bit line voltage set corresponding to the write data is applied through the write transistor to the gate of the read transistor. For this reason, information taking a high level or a low level corresponding to the write data is held at the gate of the read transistor.

At the time of a read operation, the read voltage is applied to the read word line. The read transistor is turned on or off corresponding to the information voltage held at the gate. When the read transistor is turned on, the bit line is charged by the read voltage and the bit line potential rises. Where the read transistor is off as it is, the bit line voltage does not change much at all. When this bit line voltage change is detected by the sense amplifier or the like, the information voltage is read out.

In this memory cell, the supply of the power supply voltage to the read transistor is unnecessary. Further, the capacitor is formed between the gate and the first impurity region (drain) of the read transistor, therefore the parasitic capacitance contributes to the boosting of the storage node. When the external capacitance element is added, the external capacitance element can be easily formed simultaneously with the gate electrode of the read transistor.

BRIEF DESCRIPTION OF THE DRAWINGS

The above object and features of the present invention will be more apparent from the following description of the preferred embodiments given with reference to the accompanying drawings, wherein:

FIGS. 6A to 6D are timing charts of voltage waveforms of signal lines in the read operation of the memory cell according to the second embodiment;

FIGS. 7A to 7C are timing charts of voltage waveforms of signal lines in the write operation of the memory cell according to the second embodiment;

FIGS. 8A to 8C are timing charts of voltage waveforms of signal lines in the refresh operation of the memory cell according to the second embodiment;

FIG. 12 is a circuit diagram of a memory cell according to a third embodiment;

FIGS. 13A and 13B are a plan view and a sectional view of the principal parts of the memory cell according to the third embodiment;

FIG. 21 is a circuit diagram of the configuration of the 2-transistor and 1-capacitor type memory cell of the related art;

FIGS. 22A to 22C are timing charts of the signal waveforms at the time of a read operation of the memory cell of the related art; and FIGS. 23A to 23D are timing charts of the signal waveforms at the time of a write operation of the memory cell of related art.

DETAILED DESCRIPTION OF THE PREFERRED EMBODIMENTS

Next, preferred embodiments of the present invention will be explained with reference to the drawings.

FIRST EMBODIMENT

In the first embodiment, the fundamental configuration and the operation principle of a memory cell according to the present invention will be schematically explained. Note that, in the present embodiment, the case where two bit lines are provided for a write operation and read operation is taken as the example, but it is also possible to commonly use one bit line.

Figure 1:
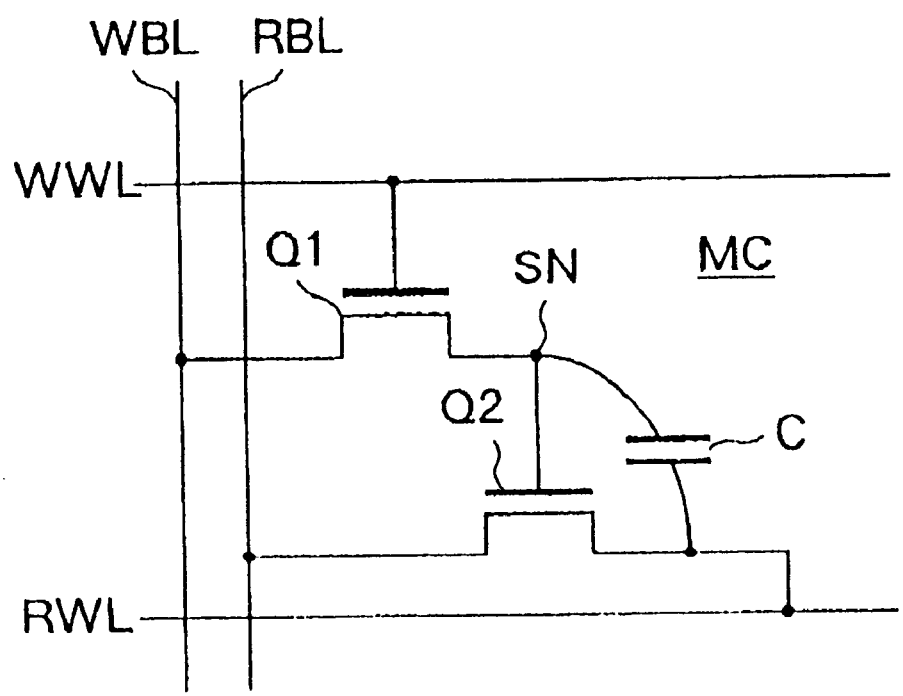
FIG. 1 is a circuit diagram of the memory cell of a semiconductor memory according to a first embodiment.

FIG. 1 is a circuit diagram of a memory cell according to the first embodiment.

A memory cell MC shown in FIG. 1 is configured by a write transistor Q1, read transistor Q2, and capacitor C. In the write transistor Q1, the gate is connected to the write word line WWL, and one of the source or drain is connected to the write bit line WBL. In the read transistor Q2, the gate is connected to the other of the source or drain of the write transistor Q1, the source is connected to the read bit line RBL, and the drain is connected to the read word line RWL. One electrode of the capacitor C is connected to a middle point of connection of the read transistor Q2 and the write transistor Q1, and the other electrode is connected to the read word line RWL. One electrode of this capacitor C and the middle point of the connection between the read transistor Q2 and the write transistor Q1 connected to this form the storage node SN of the memory cell MC.

In this memory cell MC, the bias value of the gate electrode of the read transistor Q2 varies by varying the stored charge of the storage node SN. For example, a state where the stored charge of the storage node SN is zero or small enough that the read transistor Q2 does not turn on under a predetermined bias condition at the time of a read operation is linked with the "0" non of the storage data, and a state where there is storage of a charge large enough to turn on the read transistor Q2 is linked with the "1" of the storage data.

At the time of a write operation, the write transistor Q1 is turned on by applying the write voltage of the high level to the write word line WWL. At this time, corresponding to the set voltage of the write bit line WBL, the stored charge of the storage node SN described above is changed.

Further, the read voltage of the high level is applied to the read word line RWL at the time of a read operation. By this, the voltage level of the storage node SN rises by capacitive coupling through the capacitor C. In the storage node voltage after this boosting, in the case of the storage data "1", the stored charge of the storage node SN is relatively large, so the read transistor Q2 is turned on, the charge is supplied from the read word line RWL to the read bit line RBL, and the potential thereof rises. On the other hand, when the storage data is "0", the stored charge of the storage node SN is zero or relatively small, therefore the read transistor Q2 is off as it is, and the voltage of the read bit line RBL remains in the initial state (discharge voltage).

The potential change of the read bit line RBL corresponding to this storage data is detected by a not illustrated sense amplifier and discriminated as the storage data.

Next, the conditions of the transistor threshold voltages for a normal operation in the memory cell of FIG. 1 will be presented.

Now, the threshold voltage of the write transistor Q1 is denoted as VthW, and the threshold voltage of the read transistor Q2 is denoted as VthR.

Further, as the potential of each common line when the predetermined application voltage is added at the time of a write operation, the potential of the write word line WWL is set at VWWL, the potential of the read word line is set at 0V, the potential of the write bit line WBL at the time of a write operation of "0" is set at VBL0, the potential of the write bit line WBL at the time of a write operation of "1" is set at VBL1 (>VBL0), and the potential of the read bit line RBL is set at any voltage value.

At the time of a write operation, VBL0 or VBL1 is set in the write bit line WBL corresponding to the logic of the write data. VWWL is applied to the write word line WWL in the state where the potential of the read word line RWL is brought to 0V, and the write transistor Q1 is turned on.

In the case of the "0" data write operation, the potential of the write bit line WBL is set at the low voltage level VBL0 in advance, therefore when the write transistor Q1 is turned on, the charge is drawn out of the storage node SN, and the potential of the storage node SN becomes VBL0.

On the other hand, in the case of the "1" data write operation, the potential of the write bit line WBL is set at VBL1 with the high voltage level in advance, therefore when the write transistor Q1 is turned on, the charge is supplied to the storage node SN. The potential of the storage node SN in this case becomes either a smaller potential of VBL1 or (VWWL−VthW), that is, a potential represented by:

$$\text{MIN(VBL1, VWWL−VthW)}$$

due to a so-called "Vth drop of an nMOS transistor" in the write transistor Q1.

In this way, the potential of the storage node SN after the write operation is determined by the bit line potential, a gate applied voltage and the threshold voltage of the write transistor Q1, corresponding to the write data set at the write bit line WBL.

At the time of holding of the data after the write operation, both of the potentials of the write word line WWL and the read word line RWL are set at 0V, and the potentials of the write bit line WBL and the read bit line RBL are set at any value.

At this time, the read transistor Q2 must be turned off when the voltage of the read word line RWL is 0V. For this reason, the condition for holding the data is that the threshold voltage VthR of the read transistor Q2 satisfy both of the following equation (1-1) where the holding data of the storage node SN is "0" and the following equation (1-2) where it is "1".

$$\text{VBL0} < \text{VthR} \quad (1\text{-}1)$$

$$\text{MIN(VBL1, VWWL−VthW)} < \text{VthR} \quad (1\text{-}2)$$

On the other hand, as the potential at each common line at the time of a read operation, both of the initial potentials of the write word line WWL and the read bit line RBL are set at 0V, the potential of the read word line RWL is set up at VRWL, and the potential of the write bit line WBL is set at any voltage value.

First, the read bit line RBL is discharged to the state of 0V in advance. Further, in order to keep the write transistor Q1 off, the voltage of the write word line WWL is set at 0V.

Thereafter, the predetermined voltage is applied to the read word line RWL, and the voltage thereof is set at VRWL. By this, the potential of the storage node SN, coupled to the read word line RWL through the capacitor C, rises. The final value of the potential rise of the storage node SN differs according to the potential of the storage node SN when holding the data, and the on or off state of the transistor Q2 is determined by this. That is, the read transistor Q2 remains in its off state as it is where the holding data is "0", and the read transistor Q2 shifts from the off state to the on state where the holding data is "1".

As a result, when the holding data is "1", a charge is supplied from the read word line RWL and the potential of the read bit line RBL rises, while when the holding data is "0", only the off leak current of the transistor flows in, therefore the potential of the read bit line RBL does not change much at all. In this way, the data held at the storage node SN is converted to the potential change of the read bit line RBL, and then amplified and read out.

In order to perform the read operation as described above, the threshold voltage VthR of the read transistor Q2 must be larger than the value after the voltage of the storage node SN rises at the time of holding of the "0" data and smaller than the value after the voltage of the storage node SN rises at the time of holding of the "1" data. That is, the threshold voltage VthR of the read transistor Q2 must satisfy the following equation (2).

$$\text{VBL0} + \alpha\text{VRWL} < \text{VthR} < \text{MIN(VBL1, VWWL−VthW)} + \alpha\text{VRWL} \quad (2)$$

Here, the capacitance of the capacitor C is defined as C3. Further, the remaining capacity obtained by subtracting the capacitance C3 of the capacitor C from the gate capacitance of the read transistor Q2 is defined as C0. At this time, a capacitive coupling coefficient $\alpha$ is given by $C3/(C0+C3)$ as the constant determined in advance.

The threshold voltages VthW and VthR of the read transistors Q1 and Q2 for write operation and read operation are set so as to satisfy all of the equation (1-1), equation (1-2), and equation (2), and the set voltage to the common lines are determined so that wide optimum ranges of threshold values are obtained by considering the variations etc. of the process.

Note that if the transistor threshold voltages VthW and VthR satisfying the three equations described above can be set as VBL=0V, VBL1=VWWL=VWWR=power supply voltage $V_{cc}$, it becomes possible to operate the memory cell MC without using a voltage other than the power supply voltage $V_{cc}$ and the ground potential 0V. Accordingly, in this case, it is not necessary to generate another internal power supply voltage in a peripheral circuit or form a special transistor for high voltage. Namely, from the viewpoint of the supply of the power and from the viewpoint of the process of making a high voltage resistant transistor unnecessary, this process of production of a memory is better matched with the process of production of logic circuits. Accordingly, the production of a memory logic mounting IC becomes easy.

In the memory cell MC according to the present embodiment, the supply line of the power supply voltage $V_{cc}$ (or the ground potential) is not pulled into the memory cell, therefore there is the advantage that the memory cell area can be made smaller compared with the 2-transistor and 1-capacitor type memory cell having the configuration of the related art shown in FIG. 21 by the amount of its arrangement space and contacts. Further, the capacitor C is inserted between the gate and the drain of the read transistor Q2, therefore, as will be explained in detail in the embodiments mentioned later, there is the advantage that the parasitic capacitance of the transistor can be utilized for part or all of this capacitor C, so the production process becomes easy.

Note that, in the present embodiment, the transistors were configured as n-channel types, but one or both of transistors may also be configured as the p-channel type. In this case, by appropriately reversing and controlling the logics of the corresponding signal lines, they can be operated substantially similarly.

SECOND EMBODIMENT

In the second embodiment, a more detailed explanation will be made by using a concrete example of the configuration of the memory cell array and its peripheral circuits and the plane and sectional structure of the memory cell.

Figure 2:
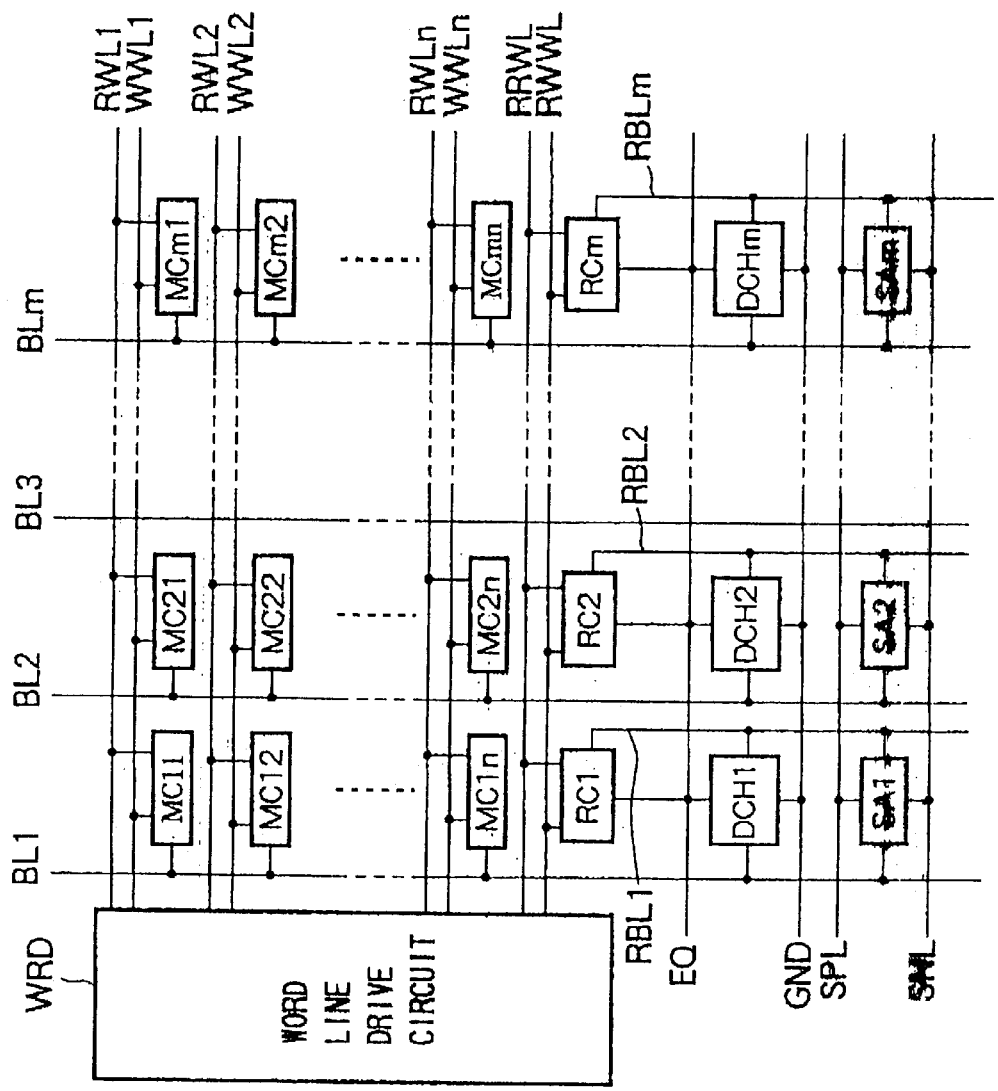
FIG. 2 is a block diagram of the principal part of a memory cell array and its peripheral circuit in a semiconductor memory according to a second embodiment.

FIG. 2 is a block diagram of principal parts of the memory cell array and peripheral circuits including a word line drive circuit, sense amplifiers, and discharge circuits in the semiconductor memory according to the second embodiment.

As illustrated, the memory cell array is configured by m×n (m, n: any natural numbers) number of memory cells MC11, MC12, ... MC21, ..., and MCmn arranged in a matrix. In the memory cell array, the memory cells of the same row are connected to the same write word lines WWLj (j=1, 2, ..., n) and read word lines RWLj, and the memory cells of the same column are connected to the same bit line BLi (i=1, 2, ..., m). A reference cell (reference memory cell) RCi, a sense amplifier SAi, and a discharge circuit DCHi are connected to the memory cell of each column. Note that, reference cells RC1, RC2, ..., and RCm are connected to reference bit lines RBL1, RBL2, ..., and RBLm. The reference bit lines RBL1, RBL2, ..., and RBLm form pairs together with the bit lines BL1, BL2, ..., and BLm. The sense amplifier SAi is connected to a bit line pair comprising a bit line BLi and a reference bit line RBLi corresponding to this.

The reference cells RC1, RC2, ..., and RCm are commonly connected to a reference write word line RWWL and a reference read word line RRWL. Note that the write word line WWLj, read word line RWLj, reference write word line RWWL, and reference read word line RRWL are all connected to the word line drive circuit WRD. At the time of a write operation, read operation, or refresh operation, one or more of word lines are selected by the word line drive circuit WRD, the write voltage is applied to the selected write word line, or the read voltage is applied to the selected read word line.

In FIG. 2, each reference cell RCi has substantially the same configuration as the memory cell MCij. Before the read operation, for example, the data "1" is written into the reference cell arranged in the same column as the selected memory cell. For this reason, for example, when the memory cell MC11 is selected and a read operation is carried out with respect to it, the voltage of the bit line BL1 is set by the storage data of the selected memory cell MC11, and the voltage of the reference bit line RBL1 corresponding to this is set by the data "1" written in the reference cell RC1. Note, by setting the voltage of the reference bit line RBL1 at for example an intermediate level between the bit line voltages corresponding to the read data "1" and "0", a constant potential difference is created between the bit line BL1 and the reference bit line RBL1.

The potential difference between the bit line BL1 and the reference bit line RBL1 is detected by the sense amplifier SA1 connected to the bit line BL1 and the reference bit line RBL1, and the storage data of the selected memory cell MC11 is read out.

Figure 3:
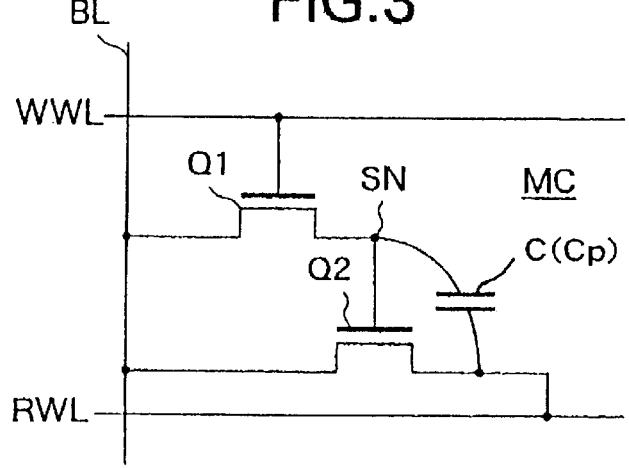
FIG. 3 is a circuit diagram of the configuration of a memory cell according to the second embodiment.

FIG. 3 shows the configuration of a memory cell MCij configuring the memory cell array shown in FIG. 2. The memory cell MC shown in FIG. 3 differs from the first embodiment in the point that the bit lines are not separated into one for a write operation and one for a read operation. Namely, the drain of the write transistor Q1 and the source of the read transistor Q2 are connected to the same bit line BL. The rest of the configuration is the same as that of the memory cell in the first embodiment, so the explanation here is omitted.

Note that, all of the memory cells configuring the memory cell array shown in FIG. 2 have the same configuration, therefore, in FIG. 3, numbers indicating the arrangement position in the matrix will be omitted and the cells denoted only as the memory cell MC. Further, numbers are not attached to the references of the word line and the bit line connected to this either.

Figure 4:
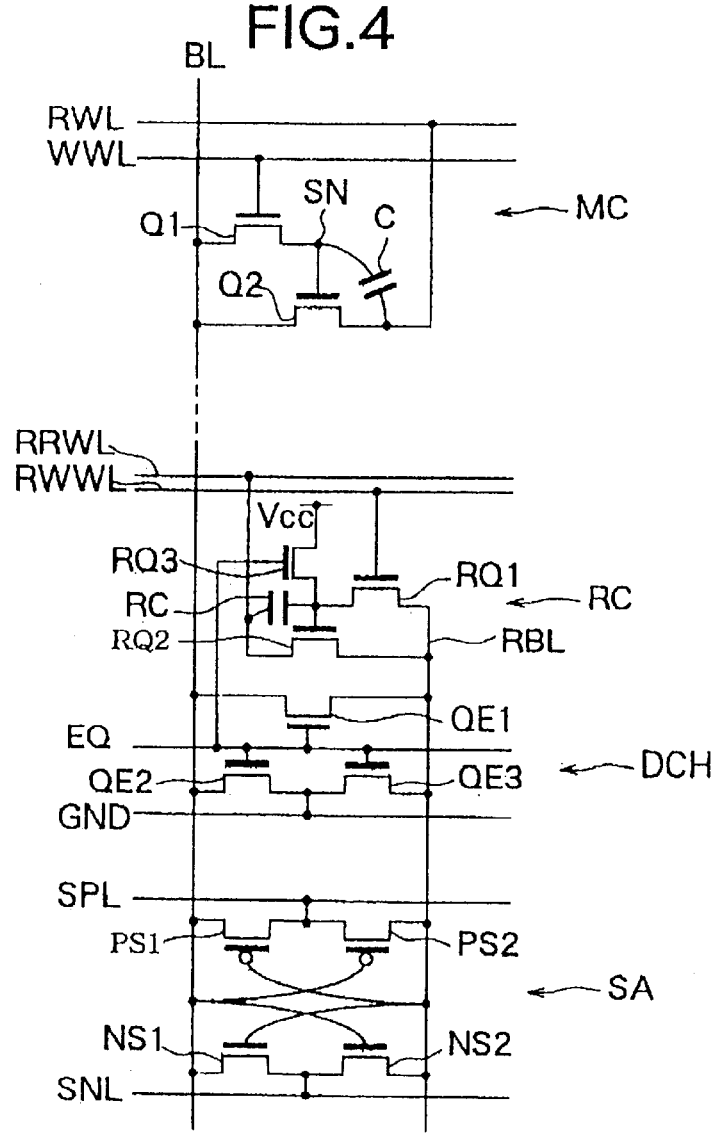
FIG. 4 is a circuit diagram of one column's worth of the configuration of a principal part of the memory cell array and its peripheral circuit according to the second embodiment.

FIG. 4 is a circuit diagram of one column's worth of the configuration of principal parts of the memory cell array and its peripheral circuit shown in FIG. 2. Note that, in FIG. 4, only one memory cell MC in the memory cell group of one column is shown for convenience. The other memory cells located in the same column as the memory cell MC have substantially the same configuration and connection configuration.

As shown in FIG. 4, a reference cell RC is configured by a reference write transistor RQ1, a reference read transistor RQ2, a reference capacitor RC, and a reference data setting transistor RQ3. The gate of the reference write transistor RQ1 is connected to the reference write word line RWWL, and its drain is connected to the reference bit line RBL. The gate of the reference read transistor RQ2 is connected to the source of the reference write transistor RQ1, its drain is connected to the reference read word line RRWL, and its source is connected to the reference bit line RBL. Further, between the gate and the drain of this reference read transistor RQ2, the reference capacitor RC is connected. Further, the gate of the reference data setting transistor RQ3 is connected to an equalize signal line EQ, its drain is connected to the supply line of the power supply voltage $V_{cc}$, and its source is connected to the gate of the reference read transistor RQ2.

Before the read operation, a high level equalize signal is applied to the equalize signal line EQ. In response to this, the reference data setting transistor RQ3 is turned on and the gate of the reference read transistor RQ2 is charged by the power supply voltage $V_{cc}$ and set at the high level. Namely, the reference data "1" is written into the reference cell RC before the read operation.

Here, for example, the gate width of the reference read transistor RQ2 configuring the reference cell RC is set smaller than the gate width of the read transistor Q2 configuring the memory cell MC. The driving capabilities of the read transistor Q2 and the reference read transistor RQ2 are determined by the gate widths of the transistors, therefore, at the time of a read operation, even in the case where the storage data of the memory cell MC is "1", the voltage of the reference bit line RBL becomes lower than the voltage of the bit line BL. By appropriately designing the ratio of the gate width of the transistor Q2 of the memory cell MC and the gate width of the transistor RQ2 of the reference cell RC, at the time of a read operation, the voltage of the reference bit line RBL can be held at the intermediate level between the voltages corresponding to the data "1" and "0" in the bit line BL. By this, where "1" is stored in the memory cell MC, the bit line BL voltage becomes higher than the voltage of the reference bit line RBL. and conversely, where "0" is stored in the memory cell MC, the voltage of the bit line BL becomes lower than the voltage of the reference bit line RBL. If the potential difference between the bit line BL and the reference bit line RBL is detected by the sense amplifier SA, the storage data of the memory cell MC can be read out.

The sense amplifier SA is configured by pHOS transistors PS1 and PS2 and nMOS transistors NS1 and NS2. Two CMOS inverters are formed by these transistors. As illustrated, the sense amplifier SA is a latch circuit with inputs and outputs of the inverters alternately connected. Positive side and negative side driving voltages are supplied to the sense amplifier SA by a positive side driving voltage supply line SPL and a negative side driving voltage supply line SNL. Note that, when driving the sense amplifier SA, for example the power supply voltage $V_{cc}$ is supplied to the positive side driving voltage supply line SPL, and the negative side driving voltage supply line SNL is held at for example the ground potential.

The discharge circuit DCH is configured by three transistors QE1, QE2, and QE3 with gates commonly connected to the equalize signal line EQ. The transistor QE1 is connected between the bit line BL and the reference bit line RBL, and the transistors QE2 and QE3 are connected in series between the bit line BL and the reference bit line RBL. The connection point of the transistors QE2 and QE3 is grounded.

Before the read operation, a signal of the high level, for example the signal of the power supply voltage $V_{cc}$ level, is applied to the equalize signal line EQ. All of the transistors QE1, QE2, and QE3 turn on in the discharge circuit DCH in response to this, so the bit line BL and the reference bit line RBL are discharged to the same potential, that is, 0V.

In the memory cell MC and the reference memory cell RMC described before, the capacitor C and the reference capacitor RC are connected between the gate and the drain of the read transistor Q2 or the reference read transistor RQ2. For this reason, in the present embodiment, the capacitors C and RC are comprised by the parasitic capacitance inside the transistor.

Figure 5A:
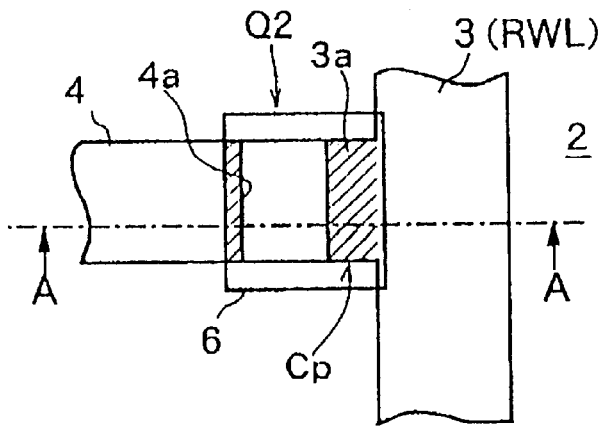
FIGS. 5A and 5B are a plan view and a sectional view of the principal part of the memory cell according to the second embodiment.
Figure 5B:
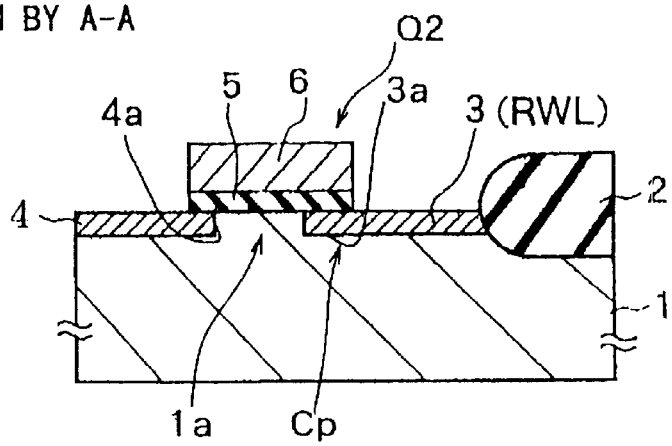

A plane view and sectional view of the connection portion of the read transistor and the read word line at which the capacitor is formed are shown in FIGS. 5A and 5B taking as an example the memory cell.

In this memory cell, an element isolation insulating layer 2 is formed on the surface of a p-type semiconductor substrate (or a p-well) 1, and a region surrounded by the element isolation insulating layer 2 has become an active region of the transistor. The read word line RWL in the present example is configured by an n$^+$ impurity region 3 formed by doping an n-type impurity into the active region surface of the semiconductor substrate (or the p-well) with a high concentration and is arranged while passing between the memory cells extending long in a direction orthogonal to the channel direction of the read transistor Q2.

In this n$^+$ impurity region 3, a projecting portion is branched to one direction from the middle thereof. This branch portion 3a configures the drain impurity region of the read transistor Q2. A source impurity region 4 formed by similarly doping the n-type impurity into the active region apart from this drain impurity region 3a with a high concentration is formed. A facing interval of the source and drain impurity regions 3 and 4 is the channel forming region of the transistor.

A gate electrode 6 of the read transistor Q2 exists on a gate insulating film 5 and overlaps part of the channel forming region, drain impurity region 3a, and source impurity region 4. Here, an overlap area on the drain impurity region 3a side is set sufficiently larger than the area of the overlap portion on the source impurity region 4 side indicated by reference numeral 4a in FIG. 5. That is, the read transistor Q2 is designed so that the parasitic capacitance between its gate and drain becomes larger than the parasitic capacitance between the gate and the source.

Note that, although not particularly illustrated, the write transistor Q1 comprises a usual MIS transistor with a symmetrical source and drain.

FIGS. 6A to 6D to FIGS. 8A to 8C are timing charts at the time of a read operation, write operation, and refresh operation of the memory cell column shown in FIG. 4.

As shown in FIG. 6C, the write word line WWL is held at the low level through out the read operation period, and the write transistor Q1 is turned off.

Preceding the read operation, first, as shown in FIG. 6A, when the equalize signal line EQ becomes the high level, the bit line BL is discharged by the discharge circuit DCH and becomes for example the ground potential. Thereafter, the bit line BL becomes the floating state.

After the discharge, as shown in FIG. 6B, a read voltage of a high level is applied to the read word line RWL. When this read voltage is applied, due to the capacitive coupling between the gate and the drain of the read transistor Q2, the gate voltage Vg is raised. At this time, the raised gate voltage Vg differs according to the storage data of the memory cell MC. For example, when the storage data of the memory cell MC is "1", the gate voltage Vg exceeds the threshold voltage VthR of the read transistor Q2, and the transistor Q2 is turned on. Conversely, where the storage data of the memory cell MC is "0", the gate voltage Vg becomes the threshold voltage VthR of the transistor Q2 or less and the transistor Q2 maintains its off state as it is.

Figure 9:
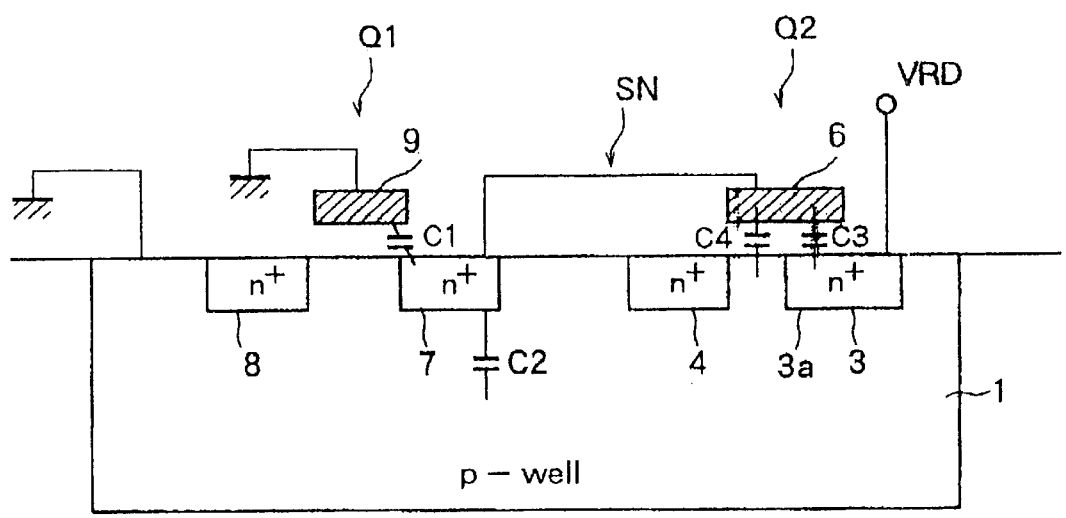
FIG. 9 is a sectional view shown an equivalent circuit of the memory cell and the biasing condition when the read voltage is applied to the memory cell according to the second embodiment.

A sectional view representing the equivalent circuit of the memory cell when applying this read voltage and the biasing condition is shown in FIG. 9.

At the right half of the p-well 1 of FIG. 9, the drain impurity region 3a of the read transistor Q2 and the n$^+$ impurity region 3 (read word line RWL), source impurity region 4, and gate electrode 6 explained by referring to FIGS. 5A and 5B are shown. Further, at the left half of the p-well 1, the source impurity region 7, the drain impurity region 8, and the gate electrode 9 (write word line WWL) of the write transistor Q1 are shown.

The gate electrode 9 of the write transistor Q1 is made of for example polyorystalline silicon doped with an impurity and is stacked on the channel forming region between the source and drain impurity regions 7 and 8 through a not illustrated gate insulating film. The gate electrode 6 of the read transistor Q2 is made of for example polyorystalline silicon doped with an impurity and is connected to the source impurity region 7 of the write transistor Q1. The gate electrode 6 of the read transistor Q2 and the source impurity region 7 of the write transistor Q1 connected in common form the storage node SN of the memory cell MC. A voltage corresponding to the storage data is held by the capacitance thereof.

The source impurity region 4 of the read transistor Q2 and the drain impurity region 8 of the write transistor Q1 are connected to the not illustrated bit line BL.

At the time of a read operation, as shown in FIG. 9, the gate electrode 9 (write word line WWL) of the write transistor Q1 and the p-well 1 are held at 0V, and a read voltage VRD of for example 1.5V is applied to the read word line RWL ($n^+$ impurity region 3) formed integrally with the drain impurity region 3a of the read transistor Q2.

Here, as shown in FIG. 9, the capacitance between the gate and the source of the write transistor Q1 is defined as C1, the capacitance between the source and the well is defined as C2, the capacitance between the gate and the drain of the read transistor Q2 is defined as C3, and the capacitance between the gate and the channel forming region is defined as C4. Before the read operation, the gate voltage (storage node voltage) Vg0 of the transistor Q2 is set corresponding to the storage data. For example, when the storage data is "1", Vg0 is 1.0V, and when the storage data is "0", Vg0 is 0V. At the time of the read operation, when the read voltage VRD of the high level is applied to the read word line RWL, the gate voltage Vg rises by the capacitive coupling between the gate and the drain of the read transistor Q2. The gate voltage Vg after this boosting is found by the following equation.

$$Vg = Vg0 + VRD \cdot \alpha$$
$$\alpha = C3/(C1+C2+C3+C4) \quad (3)$$

As shown in FIGS. 5A and 5B, in the read transistor Q2, the overlap area of the gate electrode 6 and the drain impurity region 3a is formed larger than the overlap area of the gate electrode 6 and the source impurity region 4. For this reason, the capacitance C3 between the gate and the drain of the transistor Q2 becomes larger than the capacitance between the gate and the source thereof. Here, where for example the value of the capacitive coupling coefficient $\alpha$ is 0.33 and further the read voltage VRD is 1.5V, by equation (1), the gate voltage Vg of the read transistor Q2 becomes 1.5V when the storage data is "1", and the gate voltage Vg of the read transistor Q2 becomes 0.5V when the storage data is "0".

Here, both of the threshold voltages VthW and VthR of the write transistor Q1 and the read transistor Q2 are set at 1.1V considering the substrate biasing effect. If 1.5V is applied to the drain of the read transistor Q2 in the state where the bit line BL is discharged to 0V and held in the floating state, the transistor Q2 is turned on when the storage data of the memory cell MC is "1" and the transistor Q2 is off when the storage data of the memory cell MC is "1".

When the read transistor Q2 is turned on, the bit line BL is charged by the read voltage VRD applied to the read word line RWL through the read transistor Q2, and the potential thereof rises. On the other hand, where the read transistor Q2 maintains its off state as it is, the potential of the bit line BL does not change, and the potential when it is discharged, for example, the ground potential is maintained.

In this way, at the time of a read operation, the potential of the bit line BL differs corresponding to the storage data of the memory cell MC, therefore the storage data of the memory cell MC is read by detecting the potential of the bit line BL by the sense amplifier SA.

At the time of a write operation, the write data is stored in the memory cell selected in the memory cell array shown in FIG. 2. At this write operation, there is a danger of destruction of the storage data of unselected memory cells connected to the selected word line, that is, the selected write word line WWL, and the selected read word line RWL. For this reason, at the time of write operation, a refresh operation is carried out with respect to the unselected memory cells connected to the selected word line.

In the first half of the write operation, substantially the same operation as that at the time of read operation mentioned above is carried out.

After the bit line discharge, as shown in FIG. 7A, a read voltage of the high level is applied to the selected read word line RWL at first. In response to this, the read transistors Q2 of all memory cells having the storage data "1" connected to the selected read word line RWL turn on, and corresponding to the storage data of the memory cells connected to the selected read word line RWL, the potentials of all bit lines BL connected to them change and are read out.

Next, a voltage corresponding to the write data from for example the input buffer is applied to the bit lines BL connected to the selected memory cells. Here, it is assumed that both of the threshold voltages VthW and VthR of the write transistor Q1 and the read transistor Q2 in each memory cell are 1.1V considering the substrate biasing effect. Further, assuming that the power supply voltage $V_{cc}$ is 1.5V, the voltage of the high level, for example the voltage of the power supply voltage $V_{cc}$ level (1.5) V is applied to the selected bit line BL when writing the data "1", and the voltage of the low level, for example 0V, is applied to the selected bit line BL when writing the data "1".

In this state, the write voltage is applied to the write word line WWL. The write voltage is for example a voltage of 2.1V obtained by boosting from the power supply voltage $V_{cc}$. For this reason, when writing the data "1", the voltage of 1.5V to be applied to the bit line BL is not lowered so much and is transmitted to the storage node SN through the write transistor Q1. At the time of a write operation of the data "0", the set voltage 0V of the bit line BL is transmitted to the storage node SN as it is. Namely, the held voltage of the storage node SN after writing the "1" data becomes 1.0V, and the held voltage of the storage node SN after writing the "0" data becomes 0V.

At the time of a write operation, the write operation is carried out also for the unselected memory cells connected to the write word line WWL. As described above, however, the storage data in the each unselected memory cell is read out before the write operation, and the bit line voltage corresponding to this is set at for example a binary voltage value of the amplitude of the power supply voltage $V_{cc}$. therefore a rewrite operation of the original data is carried out for the unselected memory cells. Accordingly, the destruction of data the unselected memory cells due to the write operation is prevented and, at the same time, the refresh operation for restoring the amplitude of a storage signal deteriorated along with the elapse of time to the initial value is achieved.

The refresh operation shown in FIGS. 8A to 8C is basically the same as the operation at the time of a write operation shown in FIGS. 7A to 7C except that there is no forcible change of the bit line BL voltage by the write circuit. For this reason, although a detail explanation is omitted, in the refresh operation, the read operation and the write operation are carried out all together with respect to the group of memory cells of the selected row. Those operations are carried out with respect to all memory cells in the memory cell array while changing the selected row. This refresh operation is controlled so as to be automatically executed when there is no write access for a constant period, whereby even if the charge stored in the gate of the read transistor Q2 gradually escapes due to the off leak current of the write transistor Q1, it can be periodically reset to the original stored charge before it becomes a stored charge small enough to make the read operation impossible, and as a result, data deterioration can be prevented.

FIGS. 10A to 10B and FIGS. 10A to 11B are schematic sectional views of the process of production of a memory cell according to the second embodiment at the connection portion of the read transistor and the read word line.

As mentioned before, in the memory cell according to the second embodiment, in order to enlarge the capacity C3 between the gate and the drain of the read transistor Q2, the overlap area of the gate electrode 6 and the drain impurity region 3a is formed large. Below, an explanation will be made of two examples of the method of forming the capacitor between the gate and the drain of the read transistor in the present embodiment by referring to FIGS. 10A and 10B and FIGS. 11A and 11B.

Figure 10A:
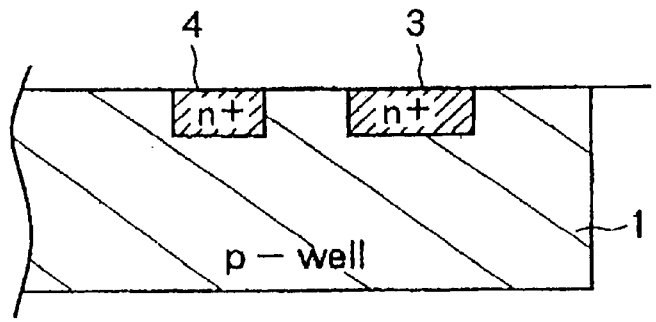
FIGS. 10A and 10B are schematic sectional views of the principal parts of a first process of production of a memory cell according to the second embodiment.

In the first method of formation, first, the source impurity region 4 and the drain impurity region 3a of the read transistor Q2 and the n$^+$ impurity region 3 forming the read word line RWL connected with the drain impurity region 3a are formed together on the surface of the formed p-well 1 as shown in FIG. 10A. Specifically, for example a resist is patterned, an n-type impurity is ion-implanted by using this as the mask, the resist is removed, and then activation annealing is carried out.

Figure 10B:
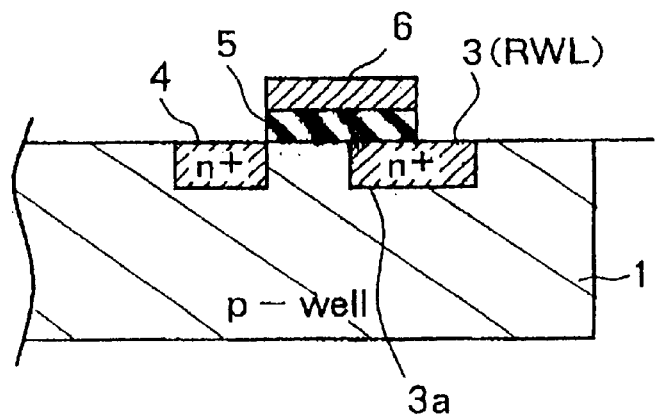

In the next step shown in next FIG. 10B, first, a gate insulating film 5 such as a silicon oxide is formed on the entire area of the silicon surface including the surfaces of the impurity regions, then a polycrystalline silicon film forming the gate electrode 6 is deposited. Next, the stacked films of the polycrystalline silicon film and the gate insulating film are patterned. This patterning is carried out so that the stacked films overlap part of the source impurity region 4 and the drain impurity region 3a, the pattern covering the entire area of the channel forming region is left, and the other peripheral portion is removed. Due to this, a gate electrode 6 having an overlap area with a drain impurity region 3a larger than the overlap area with the source impurity region 4 is formed on the gate insulating film 5. Note that, the impurity region 3 which does not overlap the gate electrode 6 and extends long in the direction vertical to FIGS. 10A and 10B becomes the read word line RWL.

Figure 11A:
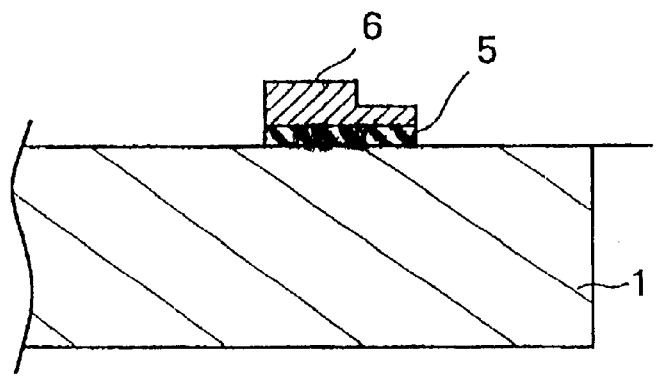
FIGS. 11A and 11B are schematic sectional views of the principal parts of a second process of production of a memory cell according to the second embodiment.
Figure 11B:
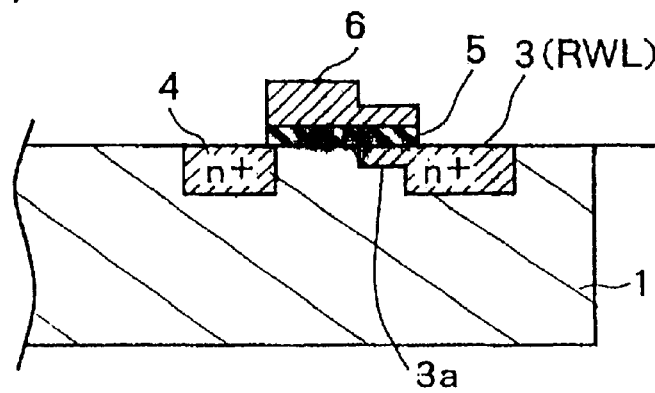

In the second method of formation shown in FIGS. 11A and 11B, after the stacked pattern of the gate electrode and the gate insulating film is formed, the impurity region is formed.

Namely, first, as shown in FIG. 11A, a gate insulating film 5 such as silicon oxide is formed on the entire area of the silicon surface, then a polycrystalline silicon film forming the gate electrode 6 is deposited.

Next, the stacked films of the polycrystalline silicon film and the gate insulating film are patterned. In this patterning, first, a first mask layer such as a resist is formed with a pattern covering the portion in which the channel forming region and the source impurity region of the read transistor Q2 are to be formed. The polycrystalline silicon film on the side at which the drain impurity region is to be formed is partially etched up to the middle of the film thickness thereof. Next, after the first mask layer is removed, a second mask layer such as resist is formed again. This second mask layer is formed with a pattern of an outline shape of the gate electrode including a step difference portion by the first etching.

In the state where the second mask layer is formed, the polycrystalline silicon film and the gate insulating film on the periphery are removed by etching. As shown in FIG. 11A, the gate electrode 6 with a drain side which becomes thin by the step difference is formed on the gate insulating film 5 formed on the surface of the p-well 1.

After removing the second mask layer, the ions of the n-type impurity are implanted by using the gate electrode 6 as a self-aligning mask. By this, the ions are implanted up to a deep portion of the p-well surface portion on the periphery of the gate electrode 6. Part of the implanted ions pass through the thin portion of the gate electrode 6 to reach the surface of the p-well 1 and dope a shallow portion of the well surface beneath the thin portion of the gate electrode 6. When the activation annealing is carried out, the source impurity region 4 and the impurity region 3 forming the read word line RWL are formed on both sides of the gate electrode 6, and the drain impurity region 3a is formed beneath the thin portion of the gate electrode 6.

The gate electrode 6 and the source impurity region 4 slightly overlap due to the diffusion in the lateral direction at the time of activation annealing, but in comparison with this, the overlap area of the gate electrode 6 and the drain impurity region 3a can be freely adjusted according to the position at which the step difference is formed and it is relatively sufficiently large.

In the memory cell according to the second embodiment, when the value obtained by subtracting the threshold voltage VthR of the read transistor Q2 from the gate voltage Vg is lower than the applied voltage VRD of the read word line RWL, the voltage appearing at the bit line BL when the storage data is "1" is restricted to that low value. For this reason, by enlarging the capacitance C3 between the gate and the drain of the read transistor Q2, the extent of change of the bit line voltage can be made larger at the time of a read operation.

In order to make the capacitance C3 between the gate and the drain of the read transistor Q2 larger, in the second embodiment, a gate parasitic capacitance Cp on the drain side of the read transistor Q2 is made larger than that on the source side. That is, by designing the overlap area of the gate electrode 6 and the drain impurity region 3a larger than the overlap area of the gate electrode 6 and the source impurity region 4, the extent of change of the bit line voltage at the time of read operation is secured. Such a capacitance is a so-called parasitic capacitance Cp. No special step is required for forming this. It can be formed together along with the formation of the read transistor Q2, therefore there is an advantage that there is no accompanying large increase of the process cost.

Note that, in the semiconductor memory of the second embodiment, in each memory cell string, the reference bit line RBL is provided other than the bit line. This reference bit line RBL is connected to only the reference cell RC, the discharge circuit DCH, and the sense amplifier SA, but not connected to the memory cell array as shown in FIG. 2 and FIG. 4. Accordingly, the reference bit line RBL may be made shorter than the usual bit line BL, so a great increase of the area of the memory cell array is not caused by the interconnection of the reference bit line RBL.

THIRD EMBODIMENT

The third embodiment relates to a modification of the memory cell capable of increasing the capacitance between the gate and the drain of the read transistor while preventing the increase of the area of the memory cell as much as possible.

FIG. 12 is a circuit diagram of a memory cell according to the third embodiment.

The difference of this memory cell from the second embodiment resides in that an external capacitance element Cex1 is connected in parallel to the transistor parasitic capacitance Cp. The rest of the configuration is similar to that of the memory cell according to the second embodiment shown in FIG. 4.

FIGS. 13A and 13B are a plan view and sectional view of the connection portion of the read transistor in which the capacitor is formed and the read word line in the memory cell according to the third embodiment.

Compared with the case of the second embodiment shown in FIGS. 5A and 5B, in this memory cell, the gate electrode 6 is extended up to the element isolation insulating layer 2 further outside from the branch portion of the n-type impurity region (drain impurity region 3a) by crossing the n$^+$ impurity region 3 forming the read word line RWL in the width direction. By this, in parallel to the transistor parasitic capacitance Cp using the drain impurity region 3a as the lower electrode and the gate electrode 6 as the upper electrode, the external capacitance element Cex1 using the n$^+$ impurity region 3 forming the read word line RWL as the lower electrode and the gate electrode 6 as the upper electrode is formed. The rest of the configuration is similar to that of the second embodiment shown in FIGS. 5A and 5B.

Figure 14:
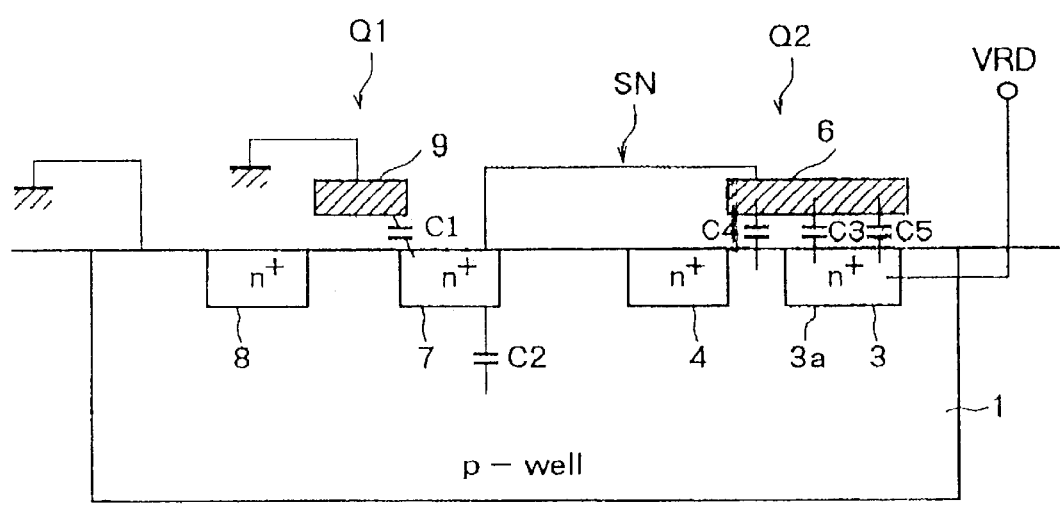
FIG. 14 is a sectional view shown the equivalent circuit of the memory cell and the biasing condition when the read voltage is applied to the memory cell according to the third embodiment.

FIG. 14 shows the configuration of this memory cell as a sectional view including an equivalent circuit.

As seen from this figure, the capacitance value between the gate and the drain of the read transistor Q2 becomes the value obtained by adding the capacitance value C3 of the parasitic capacitance Cp and the capacitance value C5 of the external capacitance element Cex1. For this reason, at the time of a read operation, when the read voltage VRD of the high level is applied to the read word line RWL, the gate voltage Vg after the boosting by the capacitive coupling between the gate and the drain of the read transistor Q2 is found by the following equation.

$$Vg = Vg0 + VRD \cdot \alpha$$

$$\alpha = (C3+C5)/(C1+C2+C3+C4+C5) \quad (4)$$

The capacitive coupling coefficient a of this equation is larger than that of the case of the equation (3) and becomes for example 0.5. For this reason, the gate voltage Vg after the boosting becomes larger in comparison with that of the second embodiment. By that amount, when the storage data is "1", the gate voltage Vg of the read transistor Q2 becomes higher, and the amplitude of the signal voltage to be read out to the bit line becomes larger. Accordingly, in the third embodiment, a semiconductor memory having a higher operation reliability in which a malfunction is further prevented even with miniaturization can be realized.

Figure 15A:
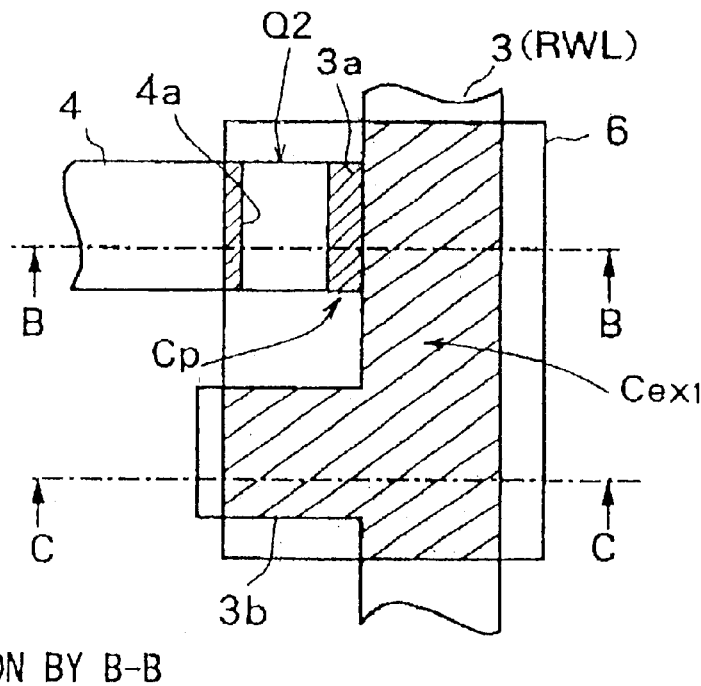
FIGS. 15A to 15C are plan view and sectional views of a modification of the third embodiment.
Figure 15B:
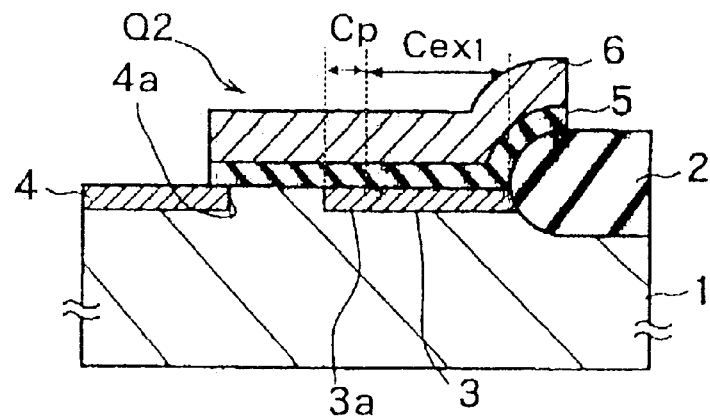
Figure 15C:
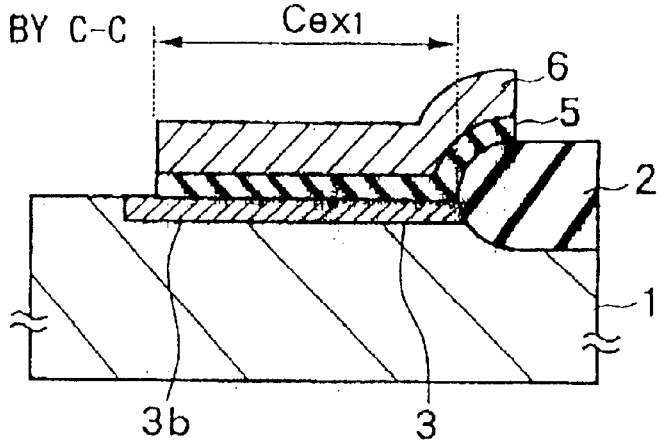

FIGS. 15A to 15C are a plan view and sectional views of a modification of the third embodiment.

In this modification, the gate electrode 6 is magnified in the interconnection direction of the read word line RWL (the vertical direction of the figure). By this, the area of the external capacitance element Cex1 is increased, and further the capacitive coupling coefficient α is made large and the amplitude of the signal voltage read out to the bit line BL is made large. If there is room in terms of space accompanied with the extension of the gate electrode 6, desirably a branch portion 3b is provided in the n$^+$ impurity region forming the read word line RWL as illustrated. This is because the area of the external capacitance element Cex1 can be further increased.

FOURTH EMBODIMENT

The fourth embodiment relates to another modification of a memory cell capable of increasing the capacitance between the gate and the drain of the read transistor while preventing the area of the memory cell as much as possible.

Figure 16:
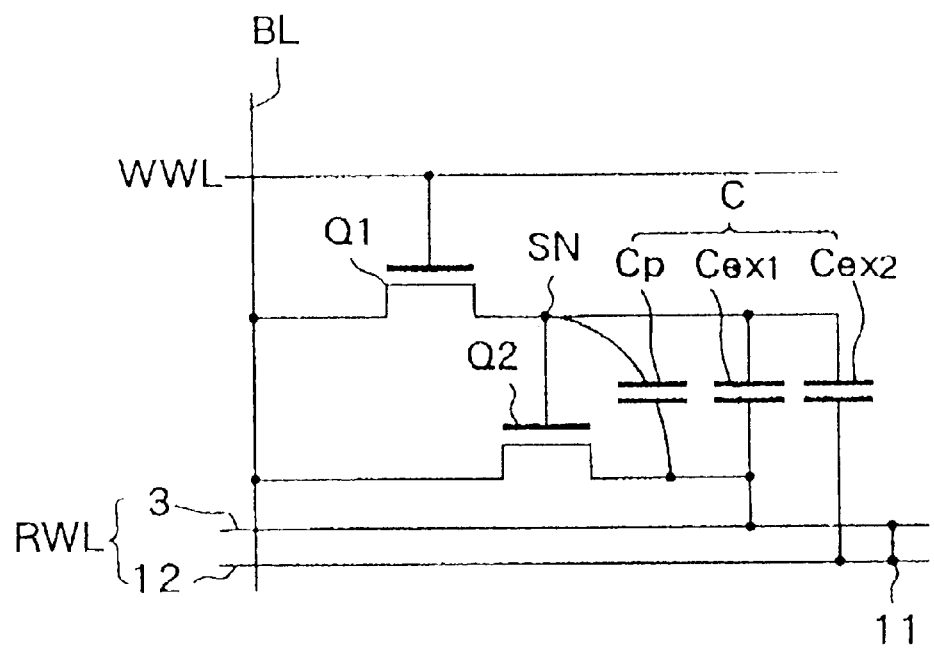
FIG. 16 is a circuit diagram of the memory cell according to a fourth embodiment.

FIG. 16 is a circuit diagram of a memory cell according to the fourth embodiment.

The difference of this memory cell from the case of the third embodiment resides in that a further external capacitance element Cex2 is connected in parallel to the transistor parasitic capacitance Cp and the external capacitance element Cex1. The rest of the configuration is similar to that of the memory cell according to the third embodiment shown in FIG. 12.

Figure 17A:
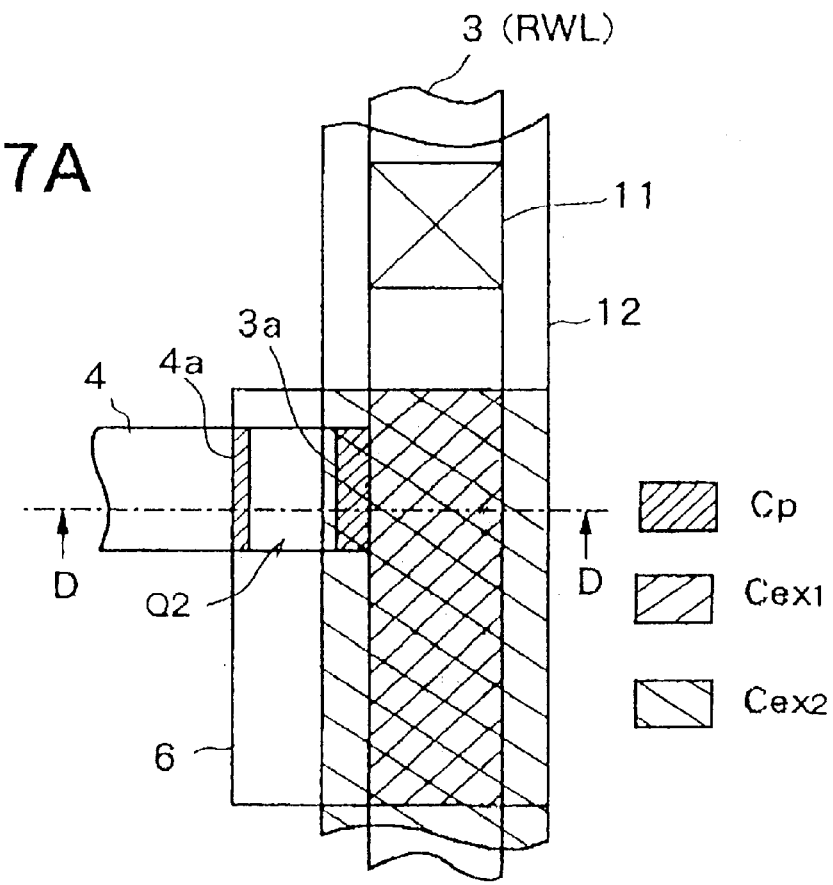
FIGS. 17A and 17B are a plan view and a sectional view of the principal part of the memory cell according to the fourth embodiment.
Figure 17B:
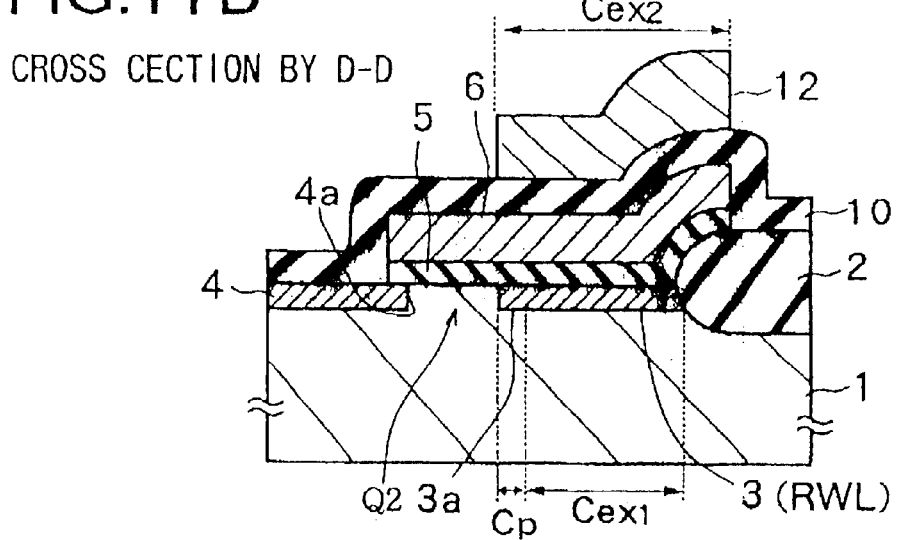
Figure 18:
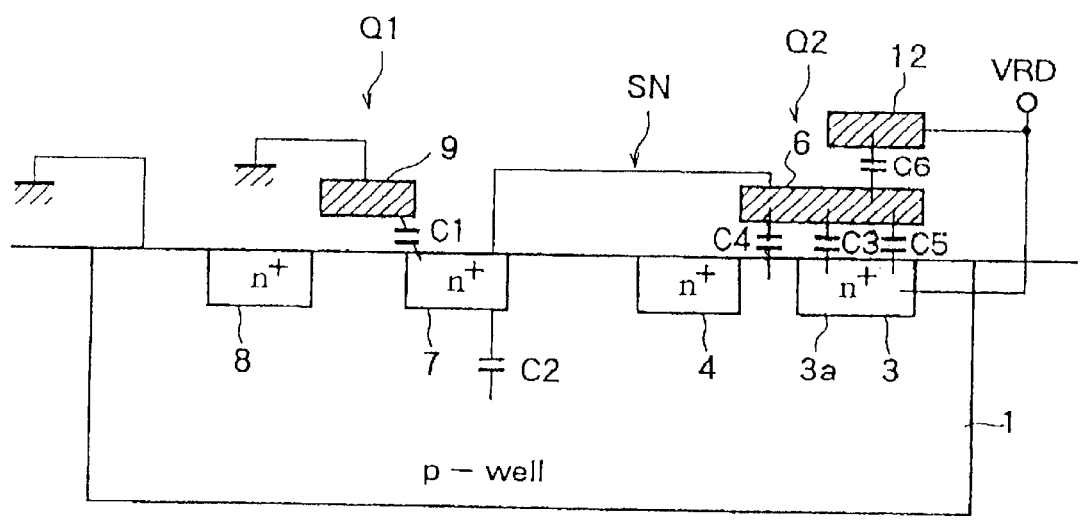
FIG. 18 is a sectional view shown an equivalent circuit of the memory cell and the biasing condition when the read voltage is applied to the memory cell according to the fourth embodiment.

A plan view and a sectional view of the connection portion of the read transistor and the read word line in which the capacitor is formed in the memory cell according to the fourth embodiment is shown in FIGS. 17A and 17B. Further, the configuration of this memory cell is shown in FIG. 18 as a sectional view including an equivalent circuit.

In this memory cell, in the same way as the case of the third embodiment shown in FIGS. 13A to FIG. 15C, the gate electrode 6 is extended up to the element isolation insulating layer 2 further outside from on the branch portion of the n-type impurity region (drain impurity region 3a) by crossing the n$^+$ impurity region 3 forming the read word line RWL in the width direction. Further, in the fourth embodiment, an interconnection layer 12 of the upper layer is provided in parallel to the n$^+$ impurity region 3 forming the read word line RWL. This interconnection layer 12 is arranged so that part overlaps the gate electrode 6 while interposing the insulating film 10 therebetween. The interconnection layer 12 is connected to the n$^+$ impurity region 3 by a contact 11 provided in the inter-layer insulating film. For this reason, an external capacitance element Cex2 using the gate electrode 6 as the lower electrode and using the interconnection layer 12 as the upper electrode is formed in parallel to the external capacitance element Cex1 using the n$^+$ impurity region 3 forming the read word line RWL as the lower electrode and using the gate electrode 6 as the upper electrode. The rest of the fundamental configuration is the same as that of the third embodiment shown in FIGS. 13A to 13B and FIGS. 15A to 15C.

As a result, the capacitor C between the gate and the drain of the read transistor Q2 becomes the value obtained by adding all of the capacitance value C3 of the parasitic capacitance Cp, the capacitance value C5 of the external capacitance element Cex1, and the capacitance value C6 of the external capacitance element Cex2. For this reason, at the time of a read operation, when the read voltage VRD of the high level is applied to the read word line RWL, the gate voltage Vg after the boosting by the capacitive coupling between the gate and the drain of the read transistor Q2 is found by the following equation.

$$Vg = Vg0 + VRD \cdot \alpha$$

$$\alpha = (C3+C5+C6)/(C1+C2+C3+C4+C5+C6) \quad (5)$$

The capacitive coupling coefficient α of this equation can be made higher in value than for example 0.5 since the capacitance value C6 of the external capacitance element Cex2 is added to its numerator and denominator. For this reason, the gate voltage Vg after boosting becomes large in comparison with that of the third embodiment. By that amount, when the storage data is "1", the gate voltage Vg of the read transistor Q2 becomes higher, and the amplitude of the signal voltage to be read out to the bit line becomes larger. Accordingly, in the fourth embodiment, a semiconductor memory having a higher operation reliability in which a malfunction is further prevented even with miniaturization can be realized.

Note that, in the fourth embodiment as well, in the same way as in FIG. 15, a branch portion 3b is provided in the n+ impurity region forming the read word line RWL, and the area of the external capacitance element Cex1 can be further increased.

FIFTH EMBODIMENT

The fifth embodiment relates to the common use of the bit line and an example of the pattern of the memory cell.

Figure 19:
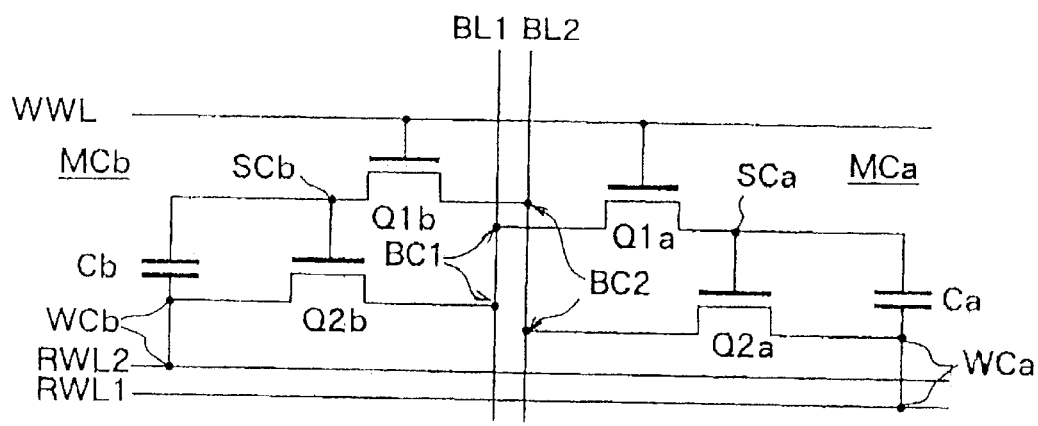
FIG. 19 is a circuit diagram of two cells' worth of the memory cells according to a fifth embodiment.

FIG. 19 is a circuit diagram of two cells' worth of the memory cells according to the fifth embodiment.

The fundamental configuration of each memory cell is similar to that of the memory cell according to the first embodiment shown in FIG. 1. Note that the read bit line is commonly used with the write bit line of the adjoining memory cell, and the write bit line is made common with the read bit line of the adjoining memory cell.

Specifically, in FIG. 19, the drain of a read transistor Q2b of a memory cell NCb is connected to the first bit line BL1 to which the drain of a write transistor Q1a of a memory cell MCa is connected. Further, the drain of a write transistor Q1b of the memory cell MCb is connected to the second bit line BL2 to which the drain of a read transistor Q2a of a memory cell MCa is connected.

Note that the write word line WWL is commonly connected to the memory cells MCa and MCb.

Figure 20A:
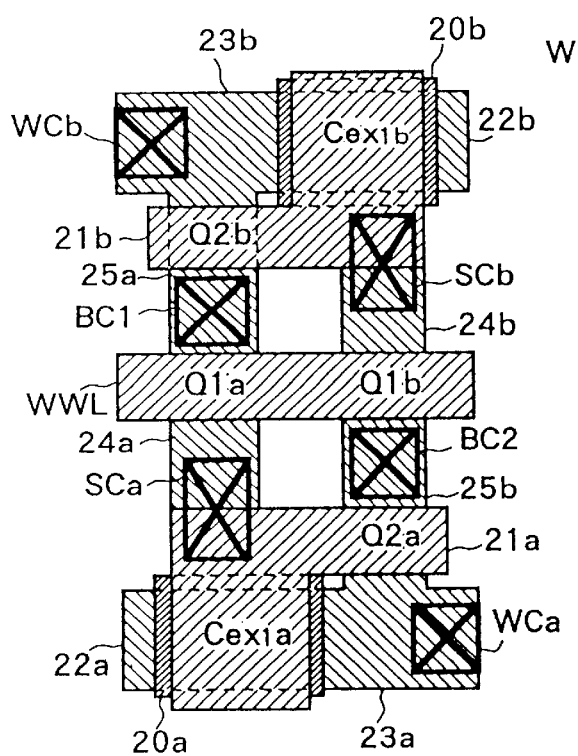
FIGS. 20A to 20C are pattern views of two cells' worth of the memory cells and sectional view shown external capacitances according to the fifth embodiment.
Figure 20B:
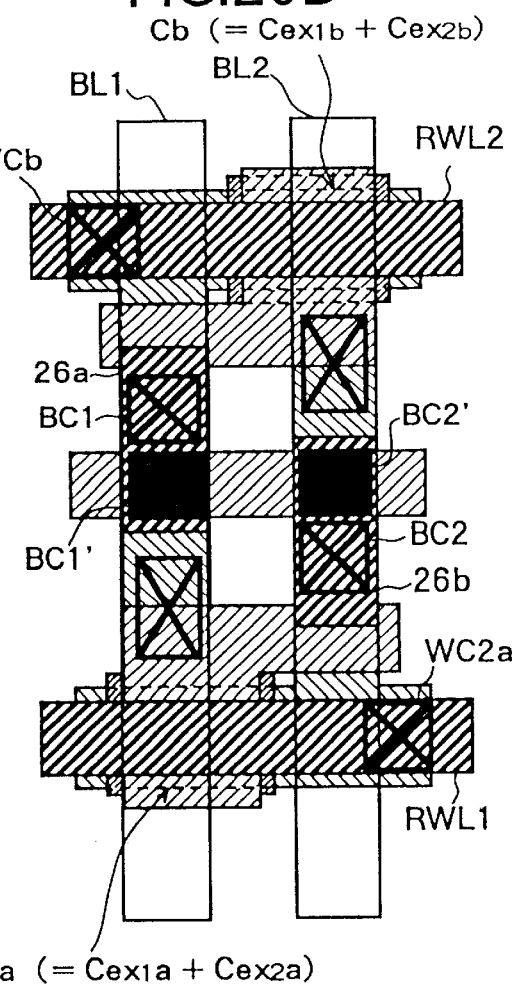
Figure 20C:
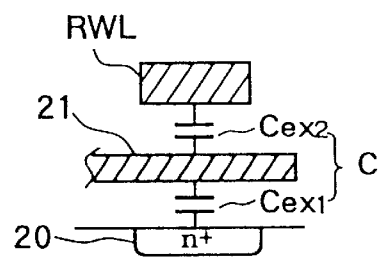

FIGS. 20A to 20C are views of the pattern of two cells' worth of the memory cells according to the fifth embodiment.

Here, FIG. 20A is a view in which patterns up to the formation of the contact hole in the first inter-layer insulating film are overlapped, and FIG. 20B is a view in which patterns up to the formation of the second metal interconnection layer are further overlapped. Note that, in FIG. 20C, the configuration of the capacitor is shown. The capacitor in the present embodiment comprises two external capacitance elements Cex1 and Cex2 using the gate electrode of the read transistor as one electrode and using the n+ impurity region and the interconnection layer vertically facing sandwiching the gate electrode therebetween as the other electrode similar to the fourth embodiment shown in FIGS. 17A and 17B.

Below, the cell structure will be clarified by sequentially explaining the process of production of this memory cell.

First, after forming the element isolation insulating layer on the surface of the p-type semiconductor substrate or the p-well, n+ impurity regions 20a and 20b having a substantially square shape are formed in advance in the active region on the periphery thereof as the lower electrode of the external capacitance element Cex1 as shown in FIG. 20A.

A gate insulating film is formed on the entire surface, polycrystalline silicon doped with an impurity is stacked on it, then they are patterned. By this, polycrystalline silicon layers 21a and 21b forming the upper electrode of the external capacitance element Cex1 are formed while intersecting with the n+ impurity regions 20a and 20b. Simultaneously, the write word line WWL common between two cells is formed along a borderline of the cells. The polycrystalline silicon layers 21a and 21b act also as the gate electrode of the read transistor, so have the gate electrode portion extended at a right angle from one side of the capacitor portion.

Ions of the n-type impurity are implanted into the active region surface on the periphery by using the thus formed polycrystalline silicon layers 21a and 21b and the write word line WWL as self-aligning masks. By this, n+ impurity regions 22a, 22b, 23a, 23b, 24a, 24b, 25a, and 25b are formed. Among them, the n+ impurity regions 22a and 23a are electrically connected by the n+ impurity region 20a formed in advance in the previous step. As a result, a lower interconnection layer of the read word line RWL1 extending long in the word line direction is formed. Similarly, due to the n+ impurity regions 20b, 22b, and 23b, the lower interconnection layer of the read word line RWL2 is formed.

Further, the write transistors Q1a and Q1b using the write word line WWL as the gate electrode and the read transistors Q2a and Q2b using the polyorystalline silicon layers 21a and 21b as the gate electrode are formed.

The first inter-layer insulating film is formed on the entire surface, then a contact hole is formed in the first inter-layer insulating film and filled with a plug or the like according to need. By this, a bit contact BC1 is formed on an n+ impurity region 25a between the write transistor Q1a and the read transistor Q2b, and a bit contact BC2 is formed on an n+ impurity region 25b between the write transistor Q1b and the read transistor Q2a. Simultaneously, at the border portion between an n+ impurity region 24a and the polyorystalline silicon layer 21a, a shared contact SCa electrically connected to the two is formed. At the border portion between an n+ impurity region 24b and the polyorystalline silicon layer 21b, a shared contact SCb electrically connected to the two is formed. Further, word contacts WCa and WCb are simultaneously formed on the n+ impurity regions 23a and 23b forming the lower interconnection layer of the read word lines RWL1 and RWL2.

Next, the first metal interconnection layer is formed on the first inter-layer insulating film with the pattern shown in FIG. 20B. Due to this, the upper interconnection layers of the read word lines RWL1 and RWL2 are formed on the word contacts WCa and WCb while connecting them to each other, and connection layers 26a and 26b are formed on the bit contacts BC1 and BC2 while connecting them to each other.

The second inter-layer insulating film is formed on the entire surface, then the bit contacts BC1' and BC2' are formed in the second inter-layer insulating film and filled by plugs or the like according to need.

Finally, the bit lines BL1 and BL2 are formed while connected to bit contacts BC1' and BC2'.

In this memory cell, the gate parasitic capacitance of that read transistor is equal between the source side and the drain side and not formed too large. The capacitor C in the memory cell is mainly comprised by two external capacitance elements Cex1 and Cex2. For this reason, the change of the capacitance value due to an alignment deviation of the gate electrode can be made small.

A selective ion implantation step is necessary for forming the n+ impurity regions 20a and 20b as the lower electrode of the external capacitance element Cex1 (Cex1a or Cex1b). However, no special step is required other than this, and the production process is simple. Note that, it is also possible to configure the capacitor C by only the external capacitance element Cex2. In this case, the step of formation of the n+ impurity regions 20a and 20b becomes unnecessary.

Further, the portion for forming the capacitors Ca and Cb is the intersecting portion of the interconnections, the increase of the area due to the formation of the capacitor is suppressed as much as possible, and also the metal interconnections can be formed by two layers.

Further, the read bit line and the write bit line are commonly used between adjoining cells, therefore, for one selected memory cell, irrespective of the fact that the bit lines are divided to ones for a read operation and ones for a write operation, there is the advantage that only one bit line's worth of arrangement space is required.

Summarizing the effect of the invention, according to the semiconductor memory according to the present invention, the interconnection space for supplying the power supply voltage or ground potential to the memory cell and the contact is unnecessary and the capacitor for boosting the storage node can be easily formed in the process of production of two transistors. For this reason, the area of the memory cell may be made smaller and the number of manufacturing steps may be reduced too.

While the invention has been described by reference to specific embodiments chosen for purposes of illustration, it should be apparent that numerous modifications could be made thereto by those skilled in the art without departing from the basic concept and scope of the invention.

What is claimed is:

1. A semiconductor memory device having a memory cell, comprising:
    a write transistor with a gate connected to a write word line and with a first impurity region forming a source or drain connected to a bit line;
    a read transistor with a gate connected to a second impurity region forming a source or drain of the write transistor, a first impurity region connected to a read word line, and a second impurity region connected to a bit line; and
    a capacitor connected between the gate and the first impurity region of the read transistor.

2. A semiconductor memory device as set forth in claim 1, wherein the capacitor includes a parasitic capacitance in said read transistor.

3. A semiconductor memory device as set forth in claim 1, wherein the capacitor includes:
    a parasitic capacitance inside the read transistor; and
    an external capacitance element connected to the outside of said read transistor.

4. A semiconductor memory device as set forth in claim 2, wherein
    said read word line includes an impurity region formed in a surface region of a semiconductor substrate or a semiconductor layer supported on a substrate; and
    said parasitic capacitance of the read transistor is formed at a portion where a gate electrode formed on a gate insulating film overlaps the first impurity region branched from an impurity region which is or is connectable to said read word line.

5. A semiconductor memory device as set forth in claim 4, wherein, in said read transistor, the area of the overlap portion between the first impurity region and the gate electrode where said parasitic capacitance is formed is larger than the area of the overlap portion between the second impurity region and gate electrode.

6. A semiconductor memory device as set forth in claim 3, wherein
    said read word line includes an impurity region formed in the surface region of a semiconductor substrate or a semiconductor layer supported on a substrate and passing between the memory cells;
    a gate electrode of said read transistor extends, on a gate insulating film, from the above of a channel forming region between said first and second impurity regions to the above of the impurity region which is or is connectable to the read word line;
    said parasitic capacitance is formed at a portion where the gate electrode of the read transistor overlaps the first impurity region thereof branched from said impurity region which is or is connectable to the read word line; and
    said external capacitance element is formed at a portion the gate electrode of the read transistor overlaps said impurity region which is or is connectable to the read word line.

7. A semiconductor memory device as set forth in claim 6, wherein said gate electrode of the read transistor intersects the straight portion of said impurity region which is or is connectable to the read word line avoiding the branching portion of the first impurity region of the read transistor from said impurity region which is or is connectable to said read word line.

8. A semiconductor memory device as set forth in claim 7, wherein, in said read transistor, the area of the overlap portion between the first impurity region and the gate electrode where said parasitic capacitance is formed is equal to the area of the overlap portion between the second impurity region and the gate electrode.

9. A semiconductor memory device as set forth in claim 3, wherein said read word line includes:
    an impurity region formed in the surface region of a semiconductor substrate or a semiconductor layer supported by a substrate and passing between memory cells; and
    an upper interconnection layer electrically connected to said impurity region, wherein a gate electrode of said read transistor extends, on a gate insulating film, from the above of a channel forming region between said first and second impurity regions to the above of said impurity region which is or is connectable to said read word line;
    said parasitic capacitance is formed at a portion where the gate electrode of the read transistor overlaps the first impurity region thereof branched from said impurity region which is or is connectable to the read word line; and
    said external capacitance element includes:
        a first capacitance element formed at a portion where said gate electrode of the read transistor exists on a gate insulating film and overlaps said impurity region which is or is connectable to the read word line; and
        a second capacitance element formed at a portion where said gate electrode of the read transistor exists on an insulating film and overlaps the further higher interconnection layer.

10. A semiconductor memory device as set forth in claim 1, further comprising:
    a write control circuit for holding said bit line at a voltage corresponding to a write data, applying a write voltage to said write word line to turn on said write transistor, transmitting a voltage corresponding to the held voltage of said bit line to a gate of said read transistor and having it held there at the time of a write operation; and
    a read control circuit for applying a read voltage to said read word line and controlling the on or off state of the read transistor in accordance with the held voltage held at the gate of the read transistor at the time of a read operation.

11. A semiconductor memory device as set forth in claim 10, further comprising a discharge circuit connected to said bit line and discharging the bit line to a reference potential at the time of start of said read operation.

12. A semiconductor memory device as set forth in claim 11, wherein said bit line is held in a floating state after being discharged by said discharge circuit.

13. A semiconductor memory device as set forth in claim 10, wherein a high level or low level held voltage held at the gate of said read transistor corresponding to the write data is set lower than a threshold voltage of the read transistor.

14. A semiconductor memory device as set forth in claim 10, wherein when said read voltage is applied to said read word line at the time of read operation, the potential of the gate of the read transistor is boosted by a capacitive coupling produced through said capacitor formed with said first impurity region, when a held voltage of the gate of the read transistor is a high level that read transistor is turned on, and when the held voltage of the gate of the read transistor is a low level that read transistor is off.

15. A semiconductor memory device as set forth in claim 1, comprising
   a first memory cell and a second memory cell with gates of write transistors connected to a common write word line and
   said bit line includes:
      a first bit line with the write transistor of said first memory cell and the read transistor of said second memory cell connected to it; and
      a second bit line with the read transistor of said first memory cell and the write transistor of said second memory cell connected to it.

16. A semiconductor memory device as set forth in claim 1, wherein:
   memory cells are arranged in an m×n array (m, n: any natural numbers),
   said write word line, said read word line, and said bit line are each connected in common between memory cells in the row direction or column direction, and
   wherein said semiconductor memory device further comprises:
      a write control circuit for holding said bit line at a voltage corresponding to a write data, applying a write voltage to said write word line to turn on said write transistor, transmitting a voltage corresponding to the held voltage of said bit line to a gate of said read transistor and having it held there at the time of a write operation;
      a read control circuit for applying a read voltage to said read word line and controlling the on or off state of the read transistor in accordance with the held voltage held at the gate of the read transistor at the time of a read operation;
      a discharge circuit connected to said bit line and discharging the bit line to a reference potential at the time of start of the read operation; and
      a sense amplifier connected to said bit line and detecting a voltage of the bit line at the time of read operation.

17. A semiconductor memory device as set forth in claim 16, wherein
   a reference memory cell connected to a reference bit line are connected for said bit line and
   said reference memory cell further comprises:
      a reference write transistor with a gate connected to a reference write word line and a first impurity region forming a source or drain connected to said reference bit line;
      a reference read transistor with a gate connected to a second impurity region forming a source or drain of said reference write transistor, a first impurity region connected to a reference read word line, and a second impurity region connected to a reference bit line; and
      a reference capacitor connected between the gate and the first impurity region of said reference read transistor.

18. A semiconductor memory device as set forth in claim 17, further comprising a reference data write circuit for writing predetermined storage data in said reference memory cell.

19. A semiconductor memory device as set forth in claim 17, wherein said discharge circuit discharges the bit line and the corresponding reference bit line to the reference voltage before reading.

20. A semiconductor memory device as set forth in claim 17, wherein said sense amplifier detects a potential difference between said bit line and said reference bit line and amplifies said detected potential difference.

\* \* \* \* \*